US009756770B2

(12) United States Patent
Ohyama et al.

(10) Patent No.: US 9,756,770 B2
(45) Date of Patent: Sep. 5, 2017

(54) DEVICE FOR MOUNTING ELECTRONIC COMPONENTS

(71) Applicant: HITACHI HIGH-TECH INSTRUMENTS CO., LTD., Kumagaya-shi, Saitama (JP)

(72) Inventors: Kazuyoshi Ohyama, Kumagaya (JP); Tsutomu Yanagida, Kumagaya (JP); Yoshinori Kano, Kumagaya (JP); Seiji Ohnishi, Kumagaya (JP); Tetsuji Ono, Kumagaya (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 213 days.

(21) Appl. No.: 14/582,881

(22) Filed: Dec. 24, 2014

(65) Prior Publication Data

US 2015/0143693 A1    May 28, 2015

Related U.S. Application Data

(63) Continuation of application No. PCT/JP2013/067137, filed on Jun. 21, 2013.

(30) Foreign Application Priority Data

Jun. 29, 2012    (JP) .................................. 2012-147278

(51) Int. Cl.
*H05K 13/08* (2006.01)
*H05K 13/04* (2006.01)
*H05K 3/30* (2006.01)

(52) U.S. Cl.
CPC ............ *H05K 13/08* (2013.01); *H05K 3/301* (2013.01); *H05K 13/0417* (2013.01); *Y10T 29/4913* (2015.01); *Y10T 29/53174* (2015.01)

(58) Field of Classification Search
CPC ...... B65H 20/22; H05K 13/02; H05K 13/021; H05K 13/0408; H05K 3/301;
(Continued)

(56) References Cited

U.S. PATENT DOCUMENTS

| 4,653,664 A | 3/1987 | Hineno et al. |
| 4,819,699 A * | 4/1989 | Brown .................. H05K 13/02 140/105 |

(Continued)

FOREIGN PATENT DOCUMENTS

| CN | 1331906 A | 1/2002 |
| CN | 1802087 A | 7/2006 |

(Continued)

OTHER PUBLICATIONS

An Office Action; "Notification of Reason for Rejection," issued by the Japanese Patent Office dated Jan. 31, 2017, which corresponds to Japanese Patent Application No. 2016-046591 and is related to U.S. Appl. No. 14/582,881.

(Continued)

*Primary Examiner* — Carl Arbes
(74) *Attorney, Agent, or Firm* — Studebaker & Brackett PC

(57) ABSTRACT

A control unit determines whether or not confirmation of a type of a tape processing unit is necessary, and performs identification processing of the type of the tape processing unit when confirmation of the type of the tape processing unit is determined as necessary. Then, this identification processing of the type is performed and the control unit determines whether or not an electronic component handleable by this tape processing unit coincides with an electronic component of a component arrangement number in a feeder base, to perform control for performing an extraction operation for an electronic component in a storage tape with an (Continued)

adsorption nozzle when the electronic component is determined as coinciding.

5 Claims, 23 Drawing Sheets

(58) Field of Classification Search
    CPC ............... H05K 13/0417; H05K 13/08; Y10T 29/4913; Y10T 29/53174
    See application file for complete search history.

(56) References Cited

U.S. PATENT DOCUMENTS

| | | | |
|---|---|---|---|
| 5,024,720 A | 6/1991 | Boss et al. | |
| 6,032,845 A | 3/2000 | Piccone et al. | |
| 6,162,007 A * | 12/2000 | Witte | B65H 20/22 221/211 |
| 6,631,870 B2 * | 10/2003 | Bergstrom | H05K 13/0417 242/615 |
| 6,782,606 B2 * | 8/2004 | Bergstrom | H05K 13/021 226/128 |
| 7,036,702 B2 | 5/2006 | Liebeke | |
| 7,805,831 B2 * | 10/2010 | Saho | H05K 13/0417 29/593 |
| 7,850,040 B2 * | 12/2010 | Davis | H05K 13/0417 221/72 |
| 9,137,936 B2 * | 9/2015 | Katsumi | H05K 13/0417 |
| 2002/0053136 A1 | 5/2002 | Bergstrom | |
| 2008/0093375 A1 | 4/2008 | Davis et al. | |
| 2009/0229117 A1 | 9/2009 | Saho et al. | |
| 2012/0285628 A1 | 11/2012 | Katsumi et al. | |

FOREIGN PATENT DOCUMENTS

| | | |
|---|---|---|
| CN | 101167417 A | 4/2008 |
| CN | 101522547 A | 9/2009 |
| JP | 62-269400 A | 11/1987 |
| JP | 2000-174492 A | 6/2000 |
| JP | 2006-173537 A | 6/2006 |
| JP | 4301853 B2 * | 7/2009 |
| JP | 2011-138834 A | 7/2011 |
| JP | 2012-074749 A | 4/2012 |
| JP | 2014-011325 A | 1/2014 |
| WO | 2011/077880 A1 | 6/2011 |

OTHER PUBLICATIONS

The First Office Action issued by the Chinese Patent Office dated Nov. 2, 2016, which corresponds to Chinese Patent Application No. 201380034873.8 and is related to U.S. Appl. No. 14/582,881.

International Search Report; PCT/JP2013/067137; dated Sep. 3, 2013.

The extended European search report issued by the European Patent Office dated Feb. 29, 2016, which corresponds to European Patent Application No. 13808516.2—1905 and is related to U.S. Appl. No. 14/582,881.

* cited by examiner

FIG.2
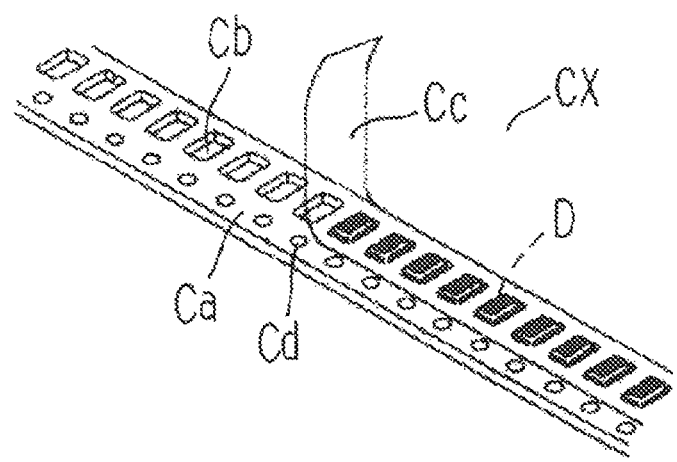
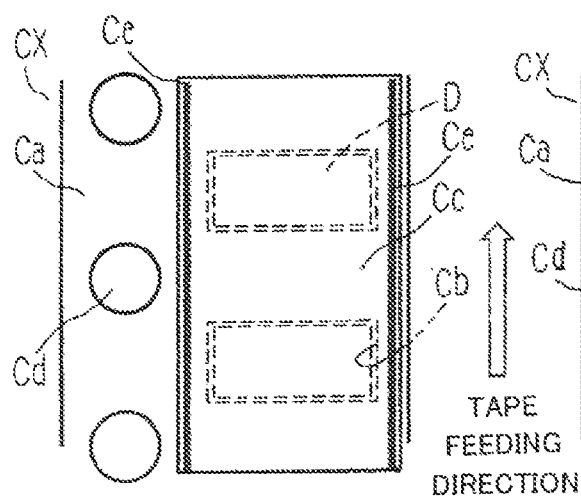
FIG. 3(a)
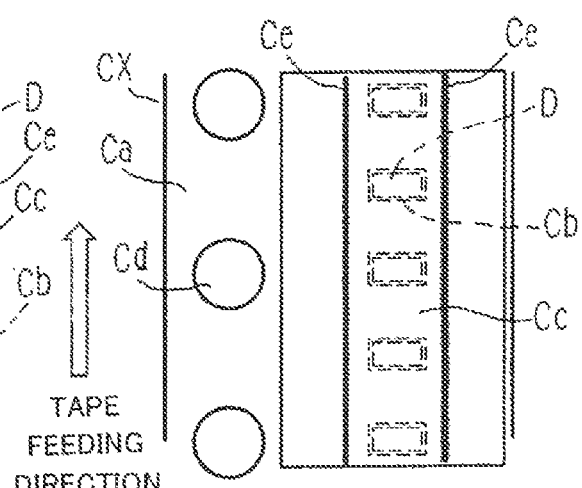
FIG. 3(b)

| TYPE | RANGE OF OBJECT COMPONENT | DIMENSION OF COMPONENT IN X DIRECTION (mm) | DIMENSION OF COMPONENT IN Y DIRECTION (mm) |
|---|---|---|---|
| W8 S | 0402~0603 | 0.40~0.60 | 0.20~0.30 |
| W8 M | 1005~1608 | 0.61~1.60 | 0.31~3.40 |
| W8 L | 1608~2012 | 1.61~2.10 | 0.31~3.40 |
| W8 LL | 2012~3225 | 2.11~4.30 | 0.31~3.40 |

FIG.24

| STEP NUMBER | X COORDINATE | Y COORDINATE | ANGLE | ARRANGEMENT NUMBER |
|---|---|---|---|---|
| 0001 | X1 | Y1 | θ1 | 101 |
| 0002 | X2 | Y2 | θ2 | 102 |
| 0003 | X3 | Y3 | θ3 | 201 |
| : | : | : | : | : |
| : | : | : | : | : |
| : | : | : | : | : |

FIG.25

| ARRANGEMENT NUMBER | COMPONENT ID |
|---|---|
| 101 | AAAAA |
| 102 | BBBBB |
| : | : |
| : | : |
| 201 | CCCCC |
| : | : |
| : | : |

FIG.26

| COMPONENT ID | BBBBB | |
|---|---|---|
| COMPONENT DIMENTION | X | XX2 |
| | Y | YY2 |
| DIMENTION | 4mm | |
| TYPE OF STORAGE TAPE | PAPER TAPE | |

| COMPONENT ID | AAAAAA | |
|---|---|---|
| COMPONENT DIMENTION | X | XX1 |
| | Y | YY1 |
| TYPE OF STORAGE TAPE | EMBOSS TAPE | |

DEVICE FOR MOUNTING ELECTRONIC COMPONENTS

CROSS REFERENCE TO RELATED APPLICATIONS

This application claims benefit of priority to Japanese Patent Application No. 2012-147278 filed on Jun. 29, 2012, and to International Patent Application No. PCT/JP2013/067137 filed on Jun. 21, 2013, the entire content of each of which is incorporated herein by reference.

TECHNICAL FIELD

The present technical field relates to a method for mounting an electronic component and a device for mounting an electronic component each including a component supply unit attachably/detachably mounted with a tape processing unit including a cutter successively cutting a cover tape covering a storage portion of a storage tape along a traveling direction following traveling of this storage tape and an outlet opening set up for extracting an electronic component in the storage portion supplied to a component extraction position in a state where the cover tape is cut open by this cutter with a component extractor for mounting the electronic component extracted from the component supply unit on a substrate.

BACKGROUND

As conventional component supply units, those of types varying with sizes have been prepared in correspondence to the sizes of electronic components stored in storage tapes, as disclosed in Japanese Patent Laying-Open No. 2012-74749 or the like, for example. Therefore, a product rendering a tape processing unit attachable/detachable to/from a unit body of a component supply unit is conceivable. This tape processing unit includes a cutter successively cutting a cover tape covering a storage portion of a storage tape along a traveling direction following traveling of this storage tape and an outlet opening set up for extracting an electronic component in the storage portion supplied to a component extraction position in a state where the cover tape is cut open by this cutter with a component extractor, and the appearance of a component supply unit rendering this tape processing unit attachable/detachable is awaited.

However, there is a possibility of mounting the tape processing unit which is not proper when attachably/detachably mounting the tape processing unit on the component supply unit, and it follows that there arises a problem of mounting an improper electronic component on a substrate when mounting this tape processing unit which is not proper.

SUMMARY

Accordingly, the present disclosure aims at rendering a proper tape processing unit mountable on a component supply unit, and mounting a proper electronic component on a substrate.

Therefore, a first disclosure is characterized in a method for mounting an electronic component, including a component supply unit attachably/detachably mounted with a tape processing unit including an outlet opening set up for exposing an electronic component having been sealed in a storage portion by a cover tape covering the storage portion of a storage tape, supplying the electronic component to a component extraction position and extracting the supplied electronic component with a component extractor, for mounting the electronic component extracted from the component supply unit on a substrate, determining whether or not confirmation of the type of the tape processing unit is necessary;

performing identification processing of the type of the tape processing unit when the confirmation of the type of the tape processing unit is determined as necessary;

determining whether or not this identification processing of the type has been performed and an electronic component handleable by this tape processing unit coincides with an electronic component of a component arrangement number in a feeder base; and performing an extraction operation for the electronic component with the component extractor when the electronic component is decided as coinciding.

A second disclosure is characterized in the method for mounting an electronic component according to the first disclosure, where the tape processing unit includes a cutter, and this cutter successively cuts and cuts open the cover tape along a traveling direction following traveling of the storage tape and exposes the electronic component in the storage portion.

A third disclosure is characterized in the method for mounting an electronic component according to the first disclosure or the second disclosure, where performing identification processing of the type of the tape processing unit when it is first extracting the electronic component after loading the storage tape on the component supply unit and the confirmation of the type of the tape processing unit is determined as necessary, and determining whether or not the confirmation of the type of the tape processing unit is necessary.

A fourth disclosure is characterized in the method for mounting an electronic component according to the first disclosure or the second disclosure, where performing identification processing of the type of the tape processing unit when it is first extracting the electronic component D after an anomaly occurrence in the component supply unit and the confirmation of the type of the tape processing unit is determined as necessary, and determining whether or not the confirmation of the type of the tape processing unit is necessary.

A fifth disclosure is characterized in that a device for mounting an electronic component, including a component supply unit attachably/detachably mounted with a tape processing unit including an outlet opening set up for exposing an electronic component having been sealed in a storage portion by a cover tape covering the storage portion of a storage tape, supplying the electronic component to a component extraction position and extracting the supplied electronic component with a component extractor, for mounting the electronic component extracted from the component supply unit on a substrate, is provided with:

a first determination device determining whether or not confirmation of the type of the tape processing unit is necessary;

an execution device executing identification processing of the type of the tape processing unit when the confirmation of the type of the tape processing unit is determined as necessary by this first determination device;

a second determination device determining whether or not the identification processing of the type has been performed by this execution device and an electronic component handleable by this tape processing unit coincides with an electronic component of a component arrangement number in a feeder base; and a control device controlling the device to perform an extraction operation of the electronic component with the component extractor when the electronic component is decided as coinciding.

A sixth disclosure is characterized in the device for mounting an electronic component according to the fifth disclosure, where the tape processing unit includes a cutter successively cutting and cutting open the cover tape along a traveling direction following traveling of the storage tape and exposing the electronic component in the storage portion.

A seventh disclosure is characterized in that, in the device for mounting an electronic component according to the fifth disclosure or the sixth disclosure, where the execution device executes the identification processing of the type of the tape processing unit when it is first extracting the electronic component after loading the storage tape on the component supply unit and the confirmation of the type of the tape processing unit is determined as necessary by the first determination means.

An eighth disclosure is characterized in that, in the device for mounting an electronic device according to the fifth disclosure or the sixth disclosure, where the execution device executes the identification processing of the type of the tape processing unit when it is first extracting the electronic component after attachment/detachment of the component supply unit to/from the feeder base and the confirmation of the type of the tape processing unit is determined as necessary by the first determination device.

A ninth disclosure is characterized in the device for mounting an electronic component according to the fifth disclosure or the sixth disclosure, where the execution device executes the identification processing of the type of the tape processing unit when it is first extracting the electronic component after an anomaly occurrence in the component supply unit and the confirmation of the type of the tape processing unit is determined as necessary by the first determination device.

The present disclosure renders a proper tape processing unit mountable on a component storage unit, and can mount a proper electronic component on a substrate.

BRIEF DESCRIPTION OF THE DRAWINGS

FIG. 2 is a perspective view of a storage tape.

FIG. 3(a) shows a storage tape for large components and FIG. 3(b) shows a storage tape for small components.

FIG. 24 is a diagram showing mount data.

FIG. 25 is a diagram showing component arrangement information.

FIG. 26 is a diagram showing component library data.

DETAILED DESCRIPTION

Figure 1:
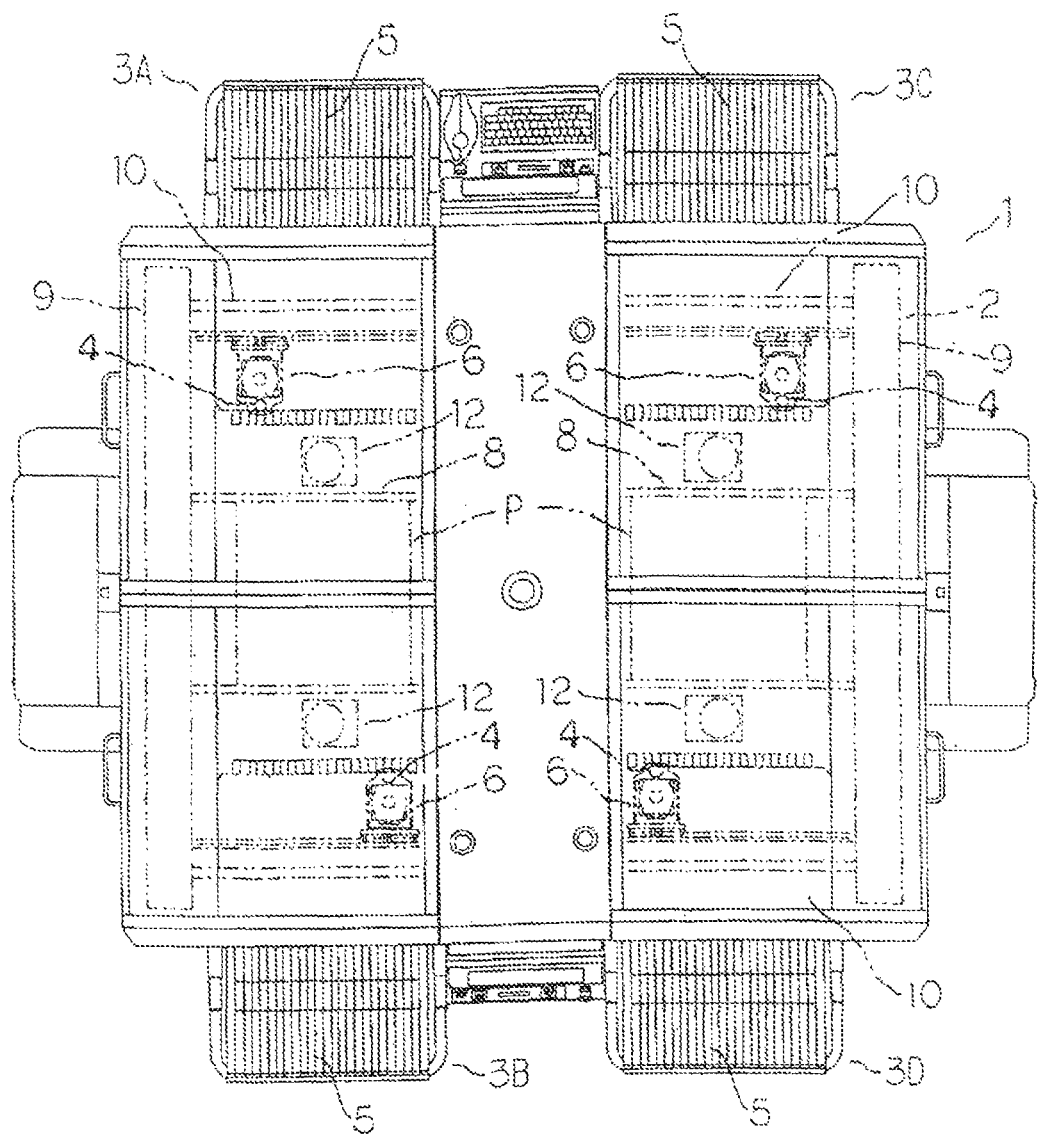
FIG. 1 is a plan view of an electronic component mounting device.

An embodiment of the present disclosure is now described on the basis of FIG. 1, which is a plan view of an electronic component mounting device 1. First, a plurality of component supply devices 3A, 3B, 3C and 3D are parallelly provided in four blocks on a front portion and a rear portion of a device body 2 of the electronic component mounting device 1.

Each of the respective component supply devices 3A, 3B, 3C and 3D is prepared by parallelly providing a large number of component supply units 5 on a feeder base of a cart base which is a mount, and attachably/detachably arranged on the device body 2 through a coupler so that a forward end portion on a component supply side faces a transport path for printed boards P as substrates, and has such a structure that power is supplied to the component supply units 5 loaded on the cart base when the cart base is normally mounted on the device body 2 and the same is movable through a caster provided on a lower surface when the coupler is released and a handle is pulled.

In a case of canceling connection between connectors connected to a power source in order to extract any component supply unit 5 from the feeder base, the power supplied to this component supply unit 5 is cut off so that a control unit 70 described later can detect this cutoff state, and when contrarily inserting and mounting the component supply unit 5 into and on the feeder base and connecting the connectors with each other, power is supplied to this component supply unit 5 and the control unit 70 described later can detect this supply state.

Each of the respective component supply devices 3A, 3B, 3C and 3D is so arranged that the forward end portion on the component supply side faces a component adsorption/extraction position PU which is a component extraction region of a mount head 6.

Supply conveyors, first positioning portions, intermediate conveyors, second positioning portions and discharge conveyors constituting substrate transport devices 8 transporting the printed boards P as the substrates are provided between the component supply devices 3B and 3D on the front side and the component supply devices 3A and 3C on the back side.

The supply conveyors transport the printed boards P received from an upstream side to the first positioning portions, transport the same to the intermediate conveyors after mounting electronic components on the substrates P positioned by unillustrated positioning mechanisms on these respective positioning portions and position the printed boards P received from these intermediate conveyors on the second positioning portions by the positioning mechanisms for mounting the electronic components, whereafter the printed boards P are transported to the discharge conveyors and thereafter transported to a downstream-side device.

Each beam 10 moving along a guide rail 9 in a Y direction by a Y-axis driving motor 11 is provided with the mounting head 6 moving in the longitudinal direction thereof, i.e., in an X direction by an X-axis driving motor 13, and this mounting head 6 is provided with a plurality of adsorption nozzles 7 which are component extractors. The mounting head 6 is loaded with a vertical axis driving motor 14 for vertically moving the adsorption nozzles 7, and loaded with a θ-axis driving motor 15 for rotating the same along perpendicular axes. Therefore, the adsorption nozzles 7 of the mounting head 6 are movable in the X direction and the Y direction, rotatable about the perpendicular axes, and vertically movable.

Numeral 4 denotes a substrate recognition camera for position recognition of the printed boards P, which is fixed to the mounting head 6 for picking up images of positioning marks provided on the printed boards P. Numeral 12 denotes a component recognition camera, which picks up images of the electronic components for performing position recognition about how much the electronic components as adsorbed/held are misregistered with respect to the adsorption nozzles 7 as to the X and Y directions and rotation angles.

A storage tape CX is described on the basis of FIG. 2 which is a perspective view of the storage tape CX. This storage tape CX stores electronic components D in storage recess portions Cb formed on a carrier tape Ca at prescribed intervals, and a cover tape Cc is bonded onto the carrier tape Ca to cover the storage recess portions Cb. Feeding holes Cd are formed on the carrier tape Ca at prescribed intervals.

Further, positions of bonding portions Ce (portions bonding (welding)/fixing the cover tape Cc to the left and right sides of the storage recess portions Cb) of the cover tape Cc vary with the sizes of the mounted electronic components, as shown in FIG. 3. In other words, storage tapes CX shown in FIG. 3(a) (left portion of FIG. 3) and (b) (right portion of FIG. 3) are both those of paper tapes of 8 mm in width, while FIG. 3(a) shows a storage tape CX for large components, in which storage recess portions Cb are large and hence bonding portions Ce applied along a traveling direction are also positioned on outer sides, and FIG. 3(b) shows a storage tape CX for small components, in which storage recess portions Cb are small and hence bonding portions Ce are also positioned on inner sides.

The structure of each of the component supply units parallelly arranged on the feeder base is now briefly described with reference to FIG. 4 which is a schematic side elevational view of the component supply unit 5 and FIG. 5 which is a schematic plan view of the component supply unit 5. First, the component supply unit 5 includes a tape introduction mechanism introducing the storage tape CX in a state wound on a rotatably mounted storage tape reel through a guide path.

This tape introduction mechanism is constituted of a DC motor 17 which is a tape introduction driving source and an introduction motor including a gear 18 on an output shaft 16 thereof and a first sprocket 23 including a worm wheel 22 meshing with a worm gear 21 provided on an intermediate portion of a rotating shaft 20 provided with a gear 19 meshing with the gear 18 so that tape feeding teeth formed on an outer peripheral portion thereof mesh with the feeding holes Cd formed on the storage tape CX pressed by a tape pressing member 24 from above for feeding this storage tape CX. Numeral denotes a first detection sensor, which is a sensor detecting the storage tape CX introduced into the component supply unit 5.

Numeral 27 denotes a second sprocket performing an operation of supplying the storage tape CX to a tape processing unit 28 attachable/detachable to/from the component supply unit 5. Numeral 29 denotes a third sprocket for advancing/moving the storage tape CX to cut open the cover tape Cc of the storage tape CX with a cutter 30 of the tape processing unit 28.

Numeral 32 denotes a servomotor, and a belt 35 is extended between a pulley provided on an output shaft 33 thereof and a pulley provided on the rotating shaft 34, so that the rotating shaft 34 rotates through the output shaft 33 and the belt 35 when the servomotor 32 normally rotates.

When the rotating shaft 34 intermittently rotates, therefore, it follows that the second sprocket 27 and the third sprocket 29 including worm wheels 39 and 40 meshing with respective worm gears 37 and 38 provided on an intermediate portion of this rotating shaft 34 intermediately rotate respectively. In other words, it follows that the second sprocket 27 and the third sprocket 29 rotate when tape feeding teeth formed on outer peripheral portions of the second sprocket 27 and the third sprocket 29 mesh with the feeding holes Cd formed on the storage tape CX pressed by a suppressor 43 from above and the rotating shaft 34 rotates, to be capable of intermittently feeding the storage tape CX.

Numeral 44 denotes a second detection sensor, which is a sensor detecting the introduced storage tape CX. In order to reliably perform grasping of a forward end position of the storage tape CX in consideration of clearance loss at the time of engagement (transfer resulting from speed difference) of the feeding holes Cd of the storage tape CX with the respective tape feeding teeth of the first sprocket 23 and the second sprocket 27, i.e., the operation of not immediately fitting but eventually engaging with the tape feeding teeth while sliding, the second detection sensor 44 is arranged between the second sprocket 27 and the third sprocket 29, for controlling the device to decelerate and then to stop when performing forward end detection of the storage tape CX.

The interval between the first sprocket 23 and the second sprocket 27 is so large that the engaging operations of the tape feeding teeth of both sprockets 23 and 27 are influenced by accumulated pitch errors of the respective feeding holes Cd of the storage tape CX, and hence the rotational frequency of the first sprocket 23 is set to a low-speed rotation slightly smaller than the rotational frequency of the second sprocket 27. In order to reduce deformation of the feeding holes Cd influencing feeding position accuracy of the storage tape CX, a rounded tooth form has been employed as the tape feeding tooth shape of the first sprocket 23, to be capable of carrying the tape to the second sprocket 27 and the third sprocket 29 in front thereof while keeping the feeding holes Cd in the initial state without deforming the same.

The second sprocket 27 and the third sprocket 29 have been arranged as close as possible to each other to be set to a span not influenced by the accumulated pitch errors, while the servomotor 32 has been employed as described above to be capable of bearing acceleration/deceleration control, speed control and torque control necessary in a tape processing sequence and set to operations according to the same driving source.

The tape processing unit 28 of a type "W8S", described later, for small components is now described on the basis of FIGS. 6 to 14. First, a guide chute 50 transporting the storage tape CX is fixed to a unit body 5A of the component supply unit 5 with fixing bolts 26, and the suppressor 43 acts to regularly press the storage tape CX transported while sliding on this guide chute 50 toward this guide chute 50 from above so that the storage tape CX does not vertically move at the time of feeding the storage tape CX and so that the feeding holes Cd of the storage tape CX do not drop and come off the tape feeding teeth of the second sprocket 27 and the third sprocket 29.

The fixation of the guide chute 50 to the unit body 5A with the fixing bolts 26 can be performed by inserting a tool through through-holes 21 set up in the upper surface of the tape processing unit 28 or through-holes 42 set up in the suppresser 43 and the through-holes 41 and screwing head portions of the fixing bolts 26.

When describing the suppresser 43 in detail, a section of this suppresser 43 presents a substantially U shape, while mounting openings 52 are set up in an upper surface 43A thereof, so that projecting portions 28A which are parts of the upper surface of the tape processing unit 28 are mounted into these mounting openings 52 in a state fitting therein from below.

Figure 7:
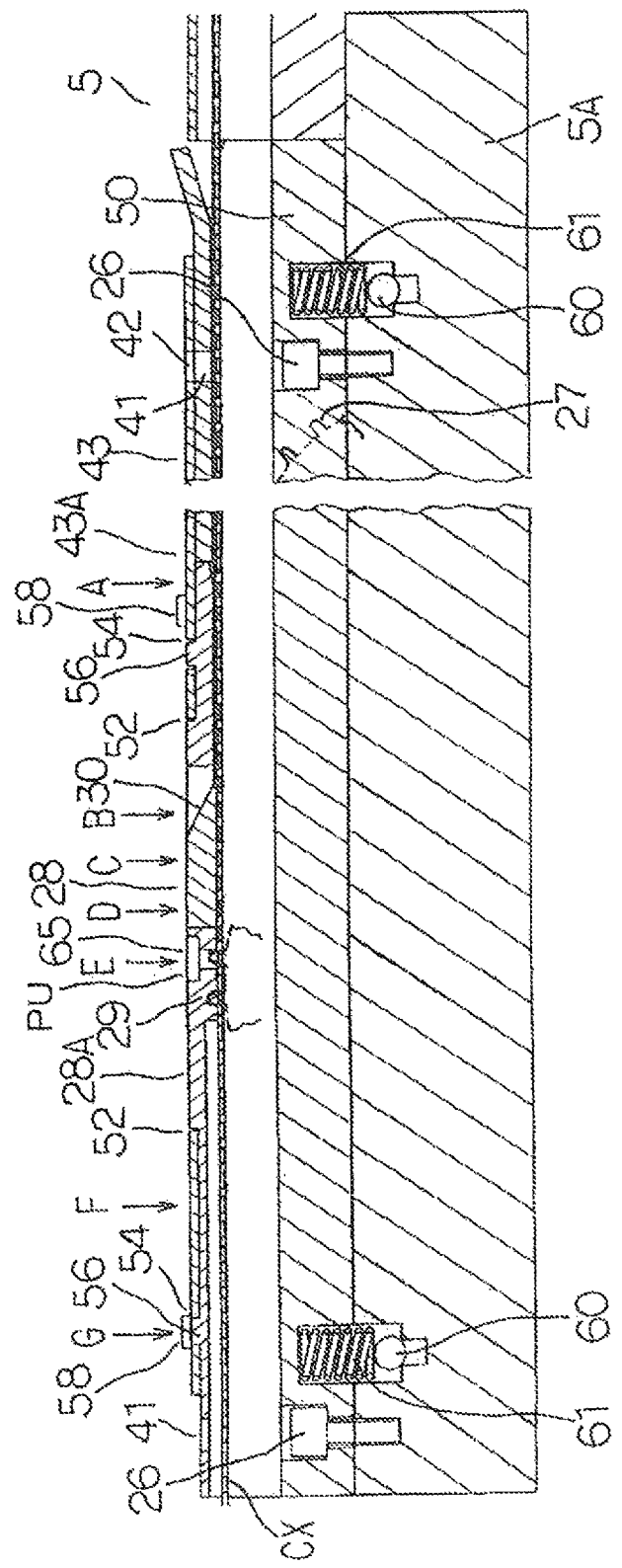
FIG. 7 is an 7-7 sectional view of a component storage unit including the tape processing unit of the type "W8" in FIG. 6.
Figure 8:
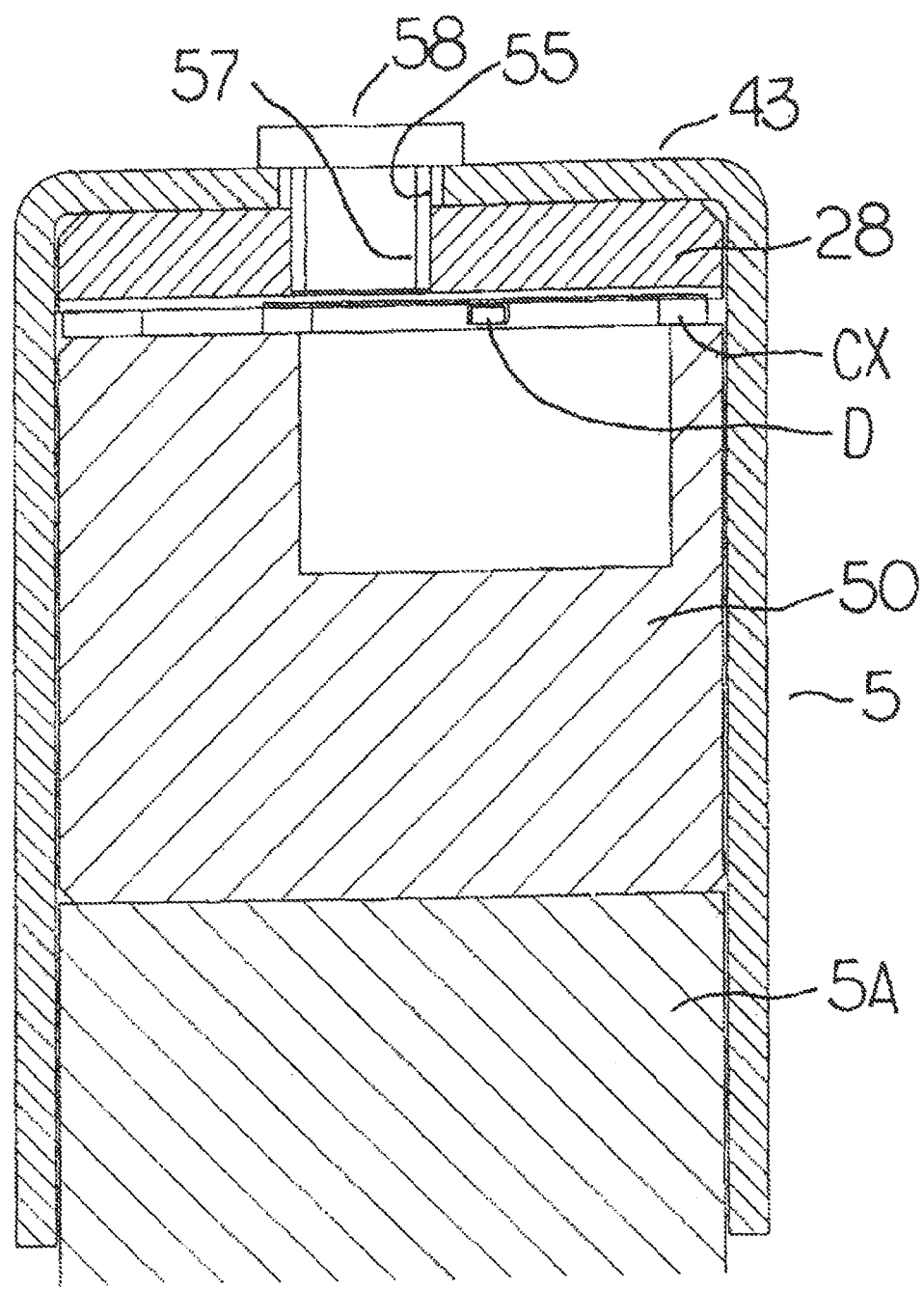
FIG. 8 is a diagram vertically sectioned from a position A in FIG. 7.
Figure 14:
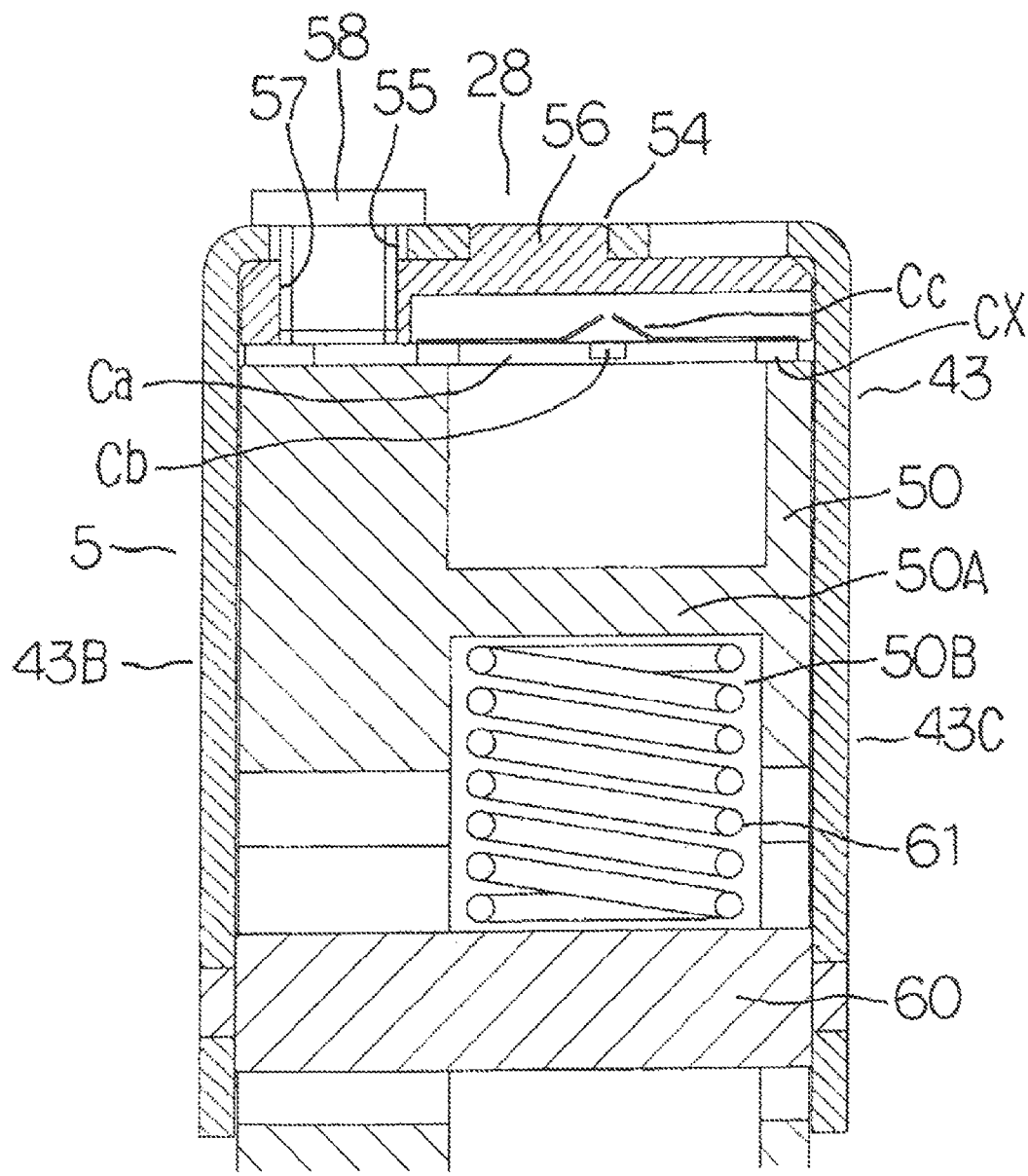
FIG. 14 is a diagram vertically sectioned from a position G in FIG. 7.

In this case, positioning openings 54 and mounting holes 55 are set up in pairs in the upper surface 43A of the suppresser 43 avoiding the mounting openings 52, and respective screw holes 57 set up in the vicinity of the positioning projecting portions 56 and the respective mounting holes 55 are matched with each other and respective fixing screws 58 mesh into the respective screw holes 57 in a state passing through the respective mounting holes 55 in a state of engaging the respective positioning projecting portions 56 formed on the upper surface of the tape processing unit 28 into the respective positioning openings 54 on the upper surface of the suppresser 43, so that the tape processing unit 28 is attachably/detachably mounted on the suppressor 43 (see FIGS. 7, 8 and 14).

Support pins 60 are provided between both side surfaces 43B and 43C of the suppressor 43 to couple the side surfaces 43B and 43C with each other, and springs 61 are arranged between these support pins 60 and storage recess portions 50B formed on a horizontal surface 50A of the guide chute 50 to regularly press the storage tape CX on the guide chute 50 onto this guide chute 50 from above due to urging force of these springs 61, so that the feeding holes Cd of the storage tape CX do not come off the tape feeding teeth of the second sprocket 27 and the third sprocket 29.

When canceling the meshing of the fixing screws 58 into the screw holes 57, extracting these fixing screws 58 from the mounting holes 55 and pressing the suppressor 43 upward against the urging force of the springs 61, it follows that the projecting portions on the upper surface of the tape processing unit 28 come off the mounting openings 52, so that the tape processing unit 28 can be detached while being drawn out from a front portion of the suppressor 43.

Figure 15:
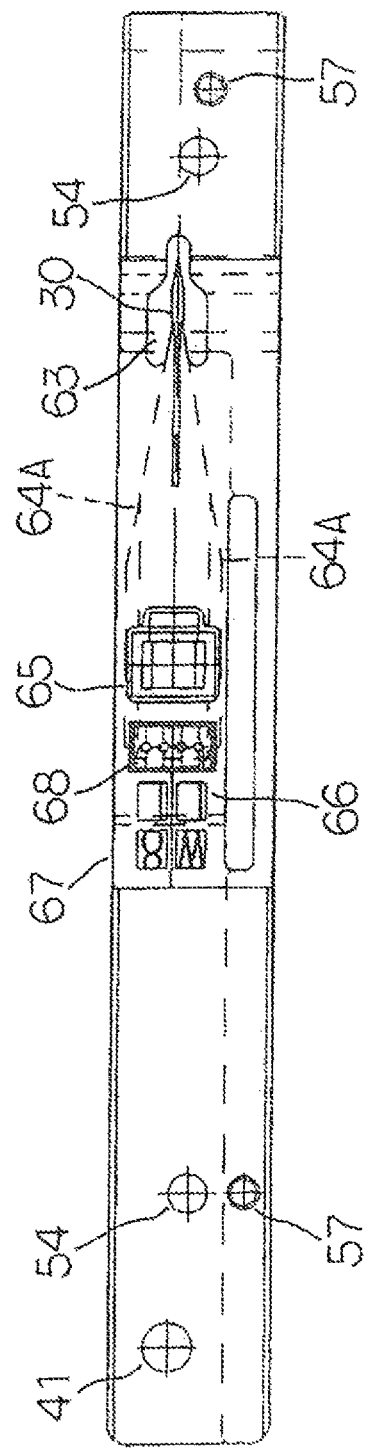
FIG. 15 is a plan view of a tape processing unit of a type "W8LL".

Therefore, a tape processing unit 28 of a type "W8LL" shown in FIG. 15 can be fixed to the suppressor 43 in place of the type "W8S" for small components. In other words, the tape processing unit 28 of this type "W8LL" can be mounted on the suppresser 43 by inserting the suppressor 43 into a portion under the tape processing unit 28 of the type "W8LL" from the front portion and meshing the respective fixing screws 58 into the respective screw holes 57 in the state passing through the respective mounting holes 58 while the respective screw holes 57 set up in the vicinity of the positioning projecting portions 56 and the respective mounting holes 55 are matched with each other in a state engaging the respective positioning projecting portions 56 formed on the upper surface of the tape processing unit 28 with the respective positioning openings 54 on the upper surface of the suppressor 43 and positioning the same.

Therefore, tape processing units 28 of different types have been rendered attachable/detachable to/from the component supply unit 5 to be capable of sharing the component supply unit 5, whereby management is easy, reduction of the management cost can be attained, and reduction of a management/custody space can be attained.

The storage recess portions Cb are also large and hence the bonding portions Ce applied along the traveling direction are also positioned on the outer side in the storage tape CX for large components in FIG. 3(a), while the tape processing unit 28 of "W8LL" for large components cannot be extracted with the electronic components D and the adsorption nozzle 7 unless the quantity of opening of the cover tape Cc is increased as compared with the tape processing unit 28 of the type "W8S" for small components, and hence the same has such a guide surface 64A that the angle of opening also increases.

Figure 6:
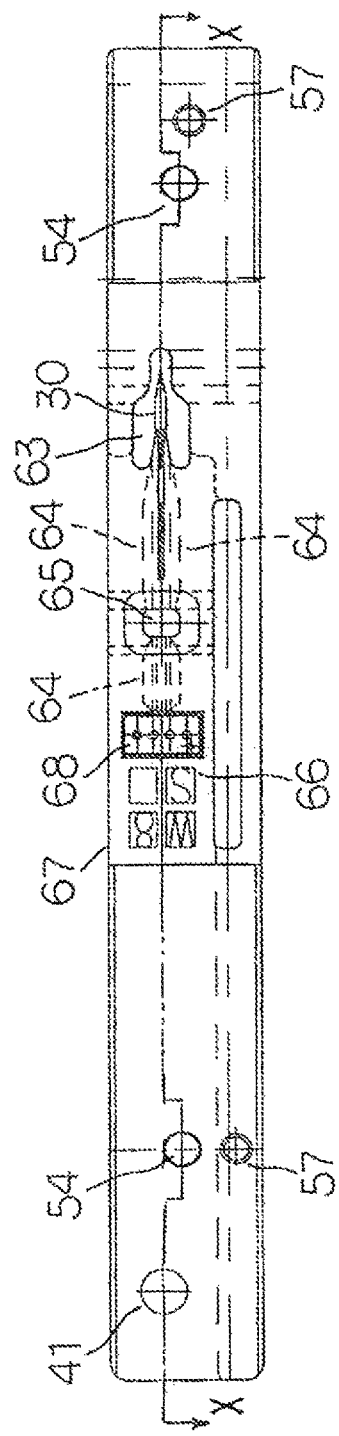
FIG. 6 is a plan view of a tape processing unit of a type "W8S".
Figure 9:
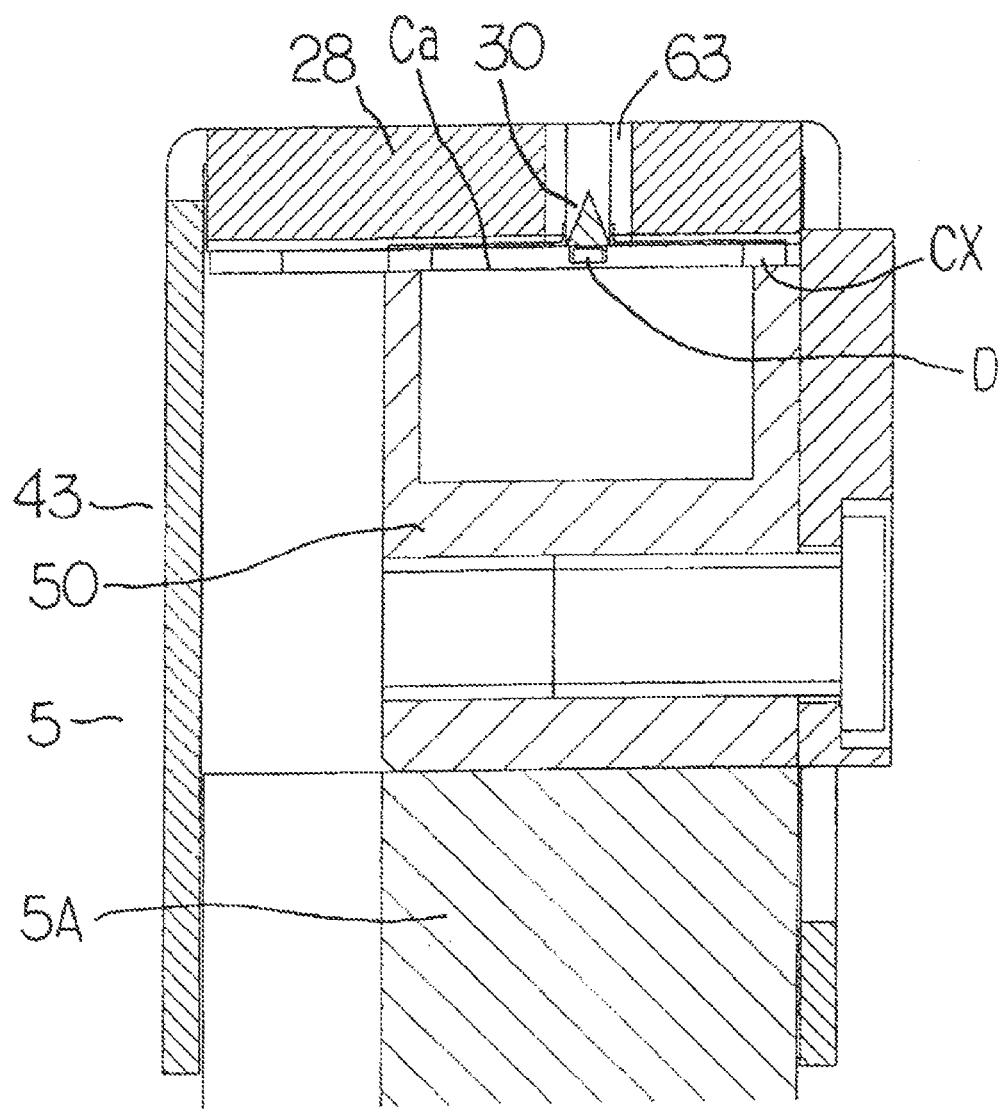
FIG. 9 is a diagram vertically sectioned from a position B in FIG. 7.
Figure 10:
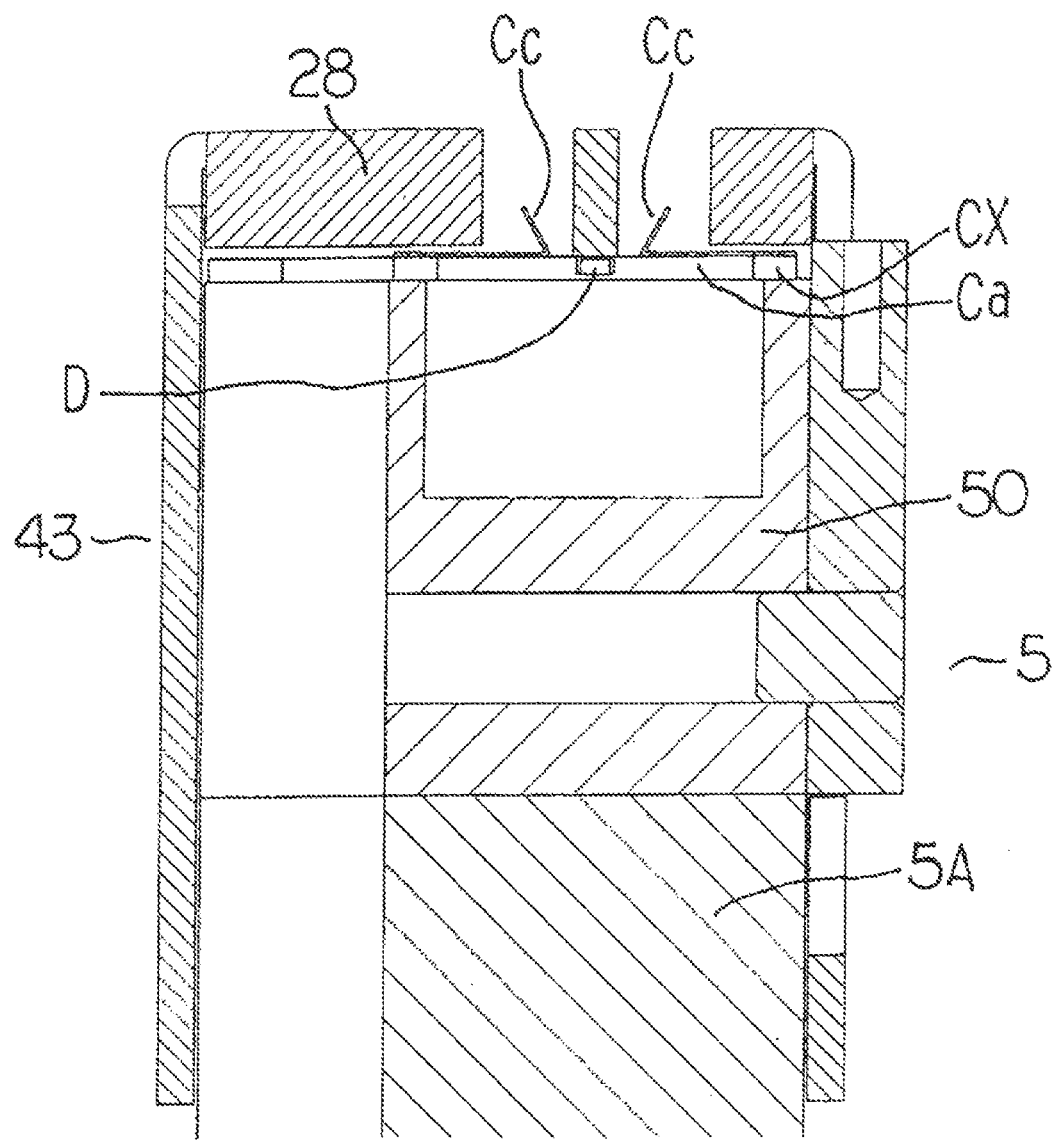
FIG. 10 is a diagram vertically sectioned from a position C in FIG. 7.
Figure 11:
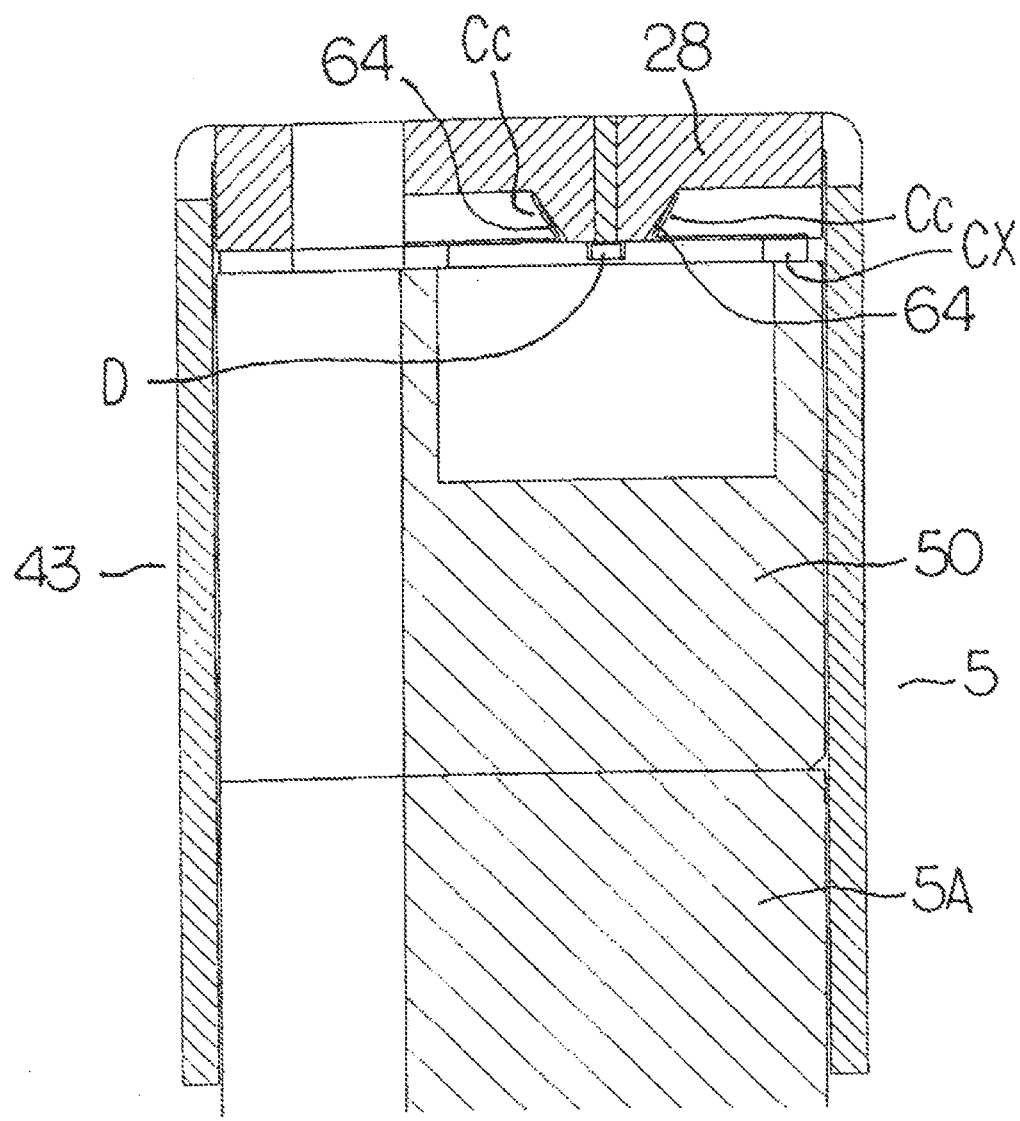
FIG. 11 is a diagram vertically sectioned from a position D in FIG. 7.

An opening 63 is set up in the tape processing unit 28, so that the cutter 30 successively cutting open the cover tape Cc of the supplied storage tape CX along the traveling direction following traveling thereof can be observed through the opening 63 (see FIGS. 6 and 9). While the cover tape Cc is successively cut open by the cutter 30 following the traveling of this storage tape CX (FIGS. 9 and 10), guide surfaces 64 guiding the cover tape Cc so that opening end portions (cut-open left and right end portions) of the cover tape Cc come to maximum height portions after being cut, i.e., to divide the cover tape Cc into left and right sections and to push open the same upward after the same is cut open (see FIG. 11).

Further, a component outlet port 65 having a larger plane surface area than the electronic components D is set up in the tape processing unit 28 (see FIGS. 6 and 12), so that the storage recess portions Cb are completely exposed on the component adsorption/extraction position PU opened wider than the width of the electronic components D stored in the storage recess portions Cb along the guide surfaces 64, and hence the electronic components D stored in the storage recess portions Cb are exposed. The adsorption nozzles 7 provided on the mounting head 6 can adsorb and extract the electronic components D in the storage recess portions Cb through the component outlet port 65.

Figure 12:
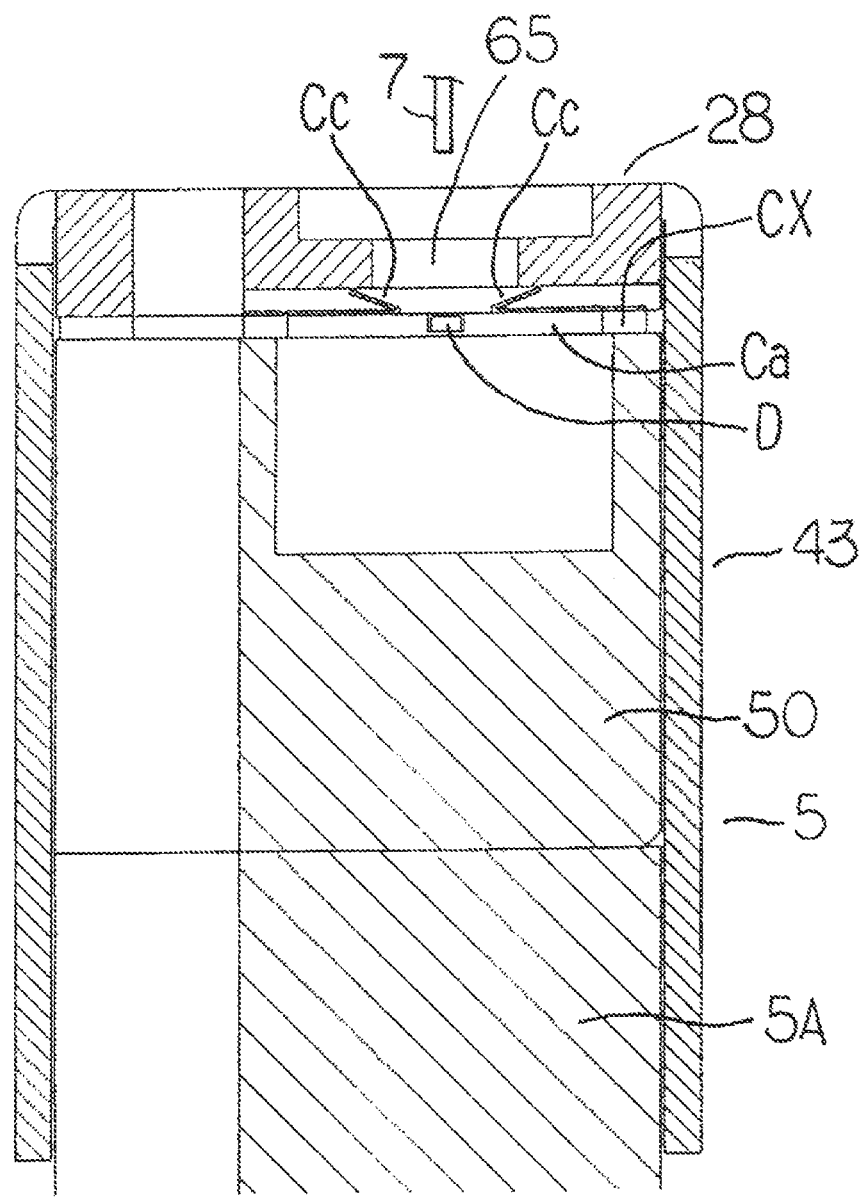
FIG. 12 is a diagram vertically sectioned from a position E in FIG. 7.
Figure 13:
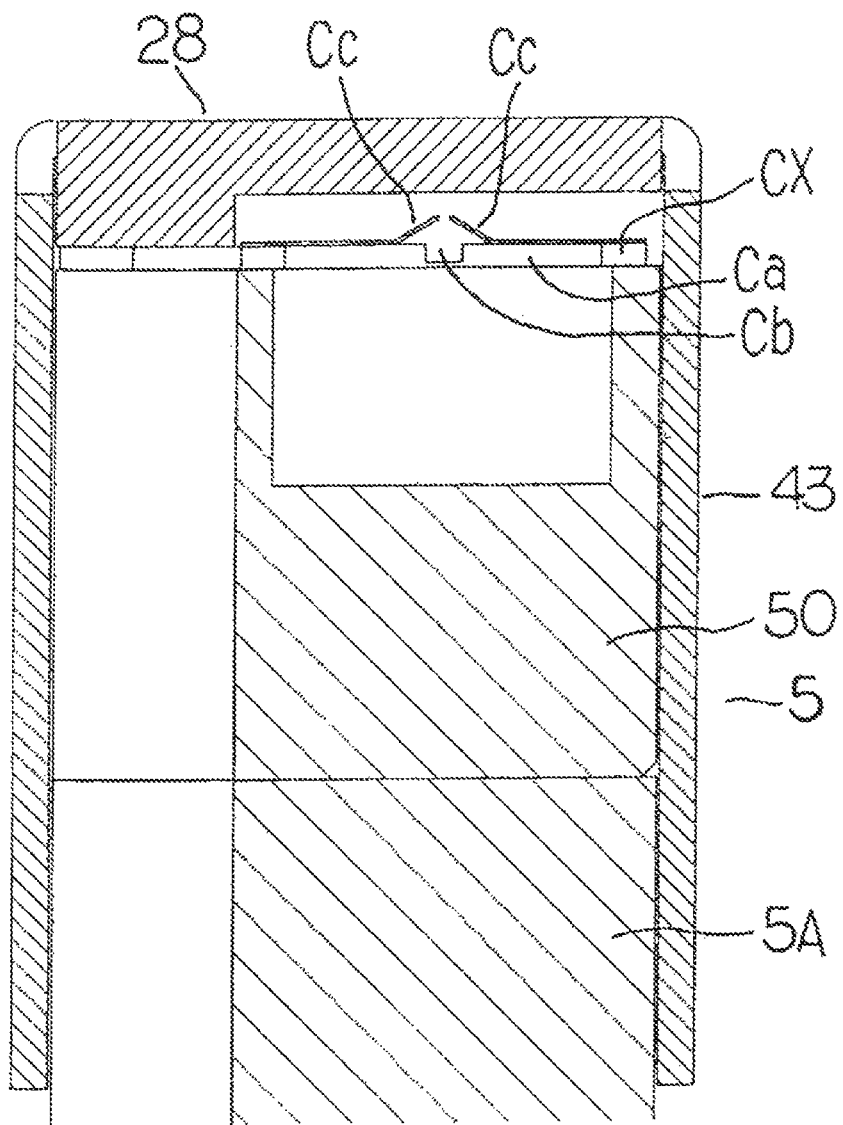
FIG. 13 is a diagram vertically sectioned from a position F in FIG. 7.

However, while each of the guide surfaces 64 cannot be formed on a region where this component outlet port 65 is formed, the guide surfaces 64 are formed again on the left and right sides in a portion ahead of the component outlet port 65 in the traveling direction (see FIG. 6), and these guide surfaces 64 are eventually not formed (FIGS. 12 to 14).

Figure 16:
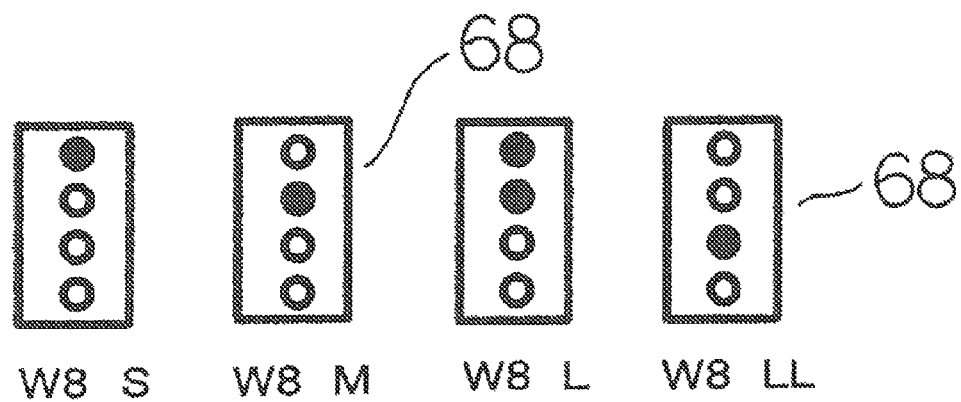
FIG. 16 is a diagram showing type determination identification information for tape processing units.
Figure 17:
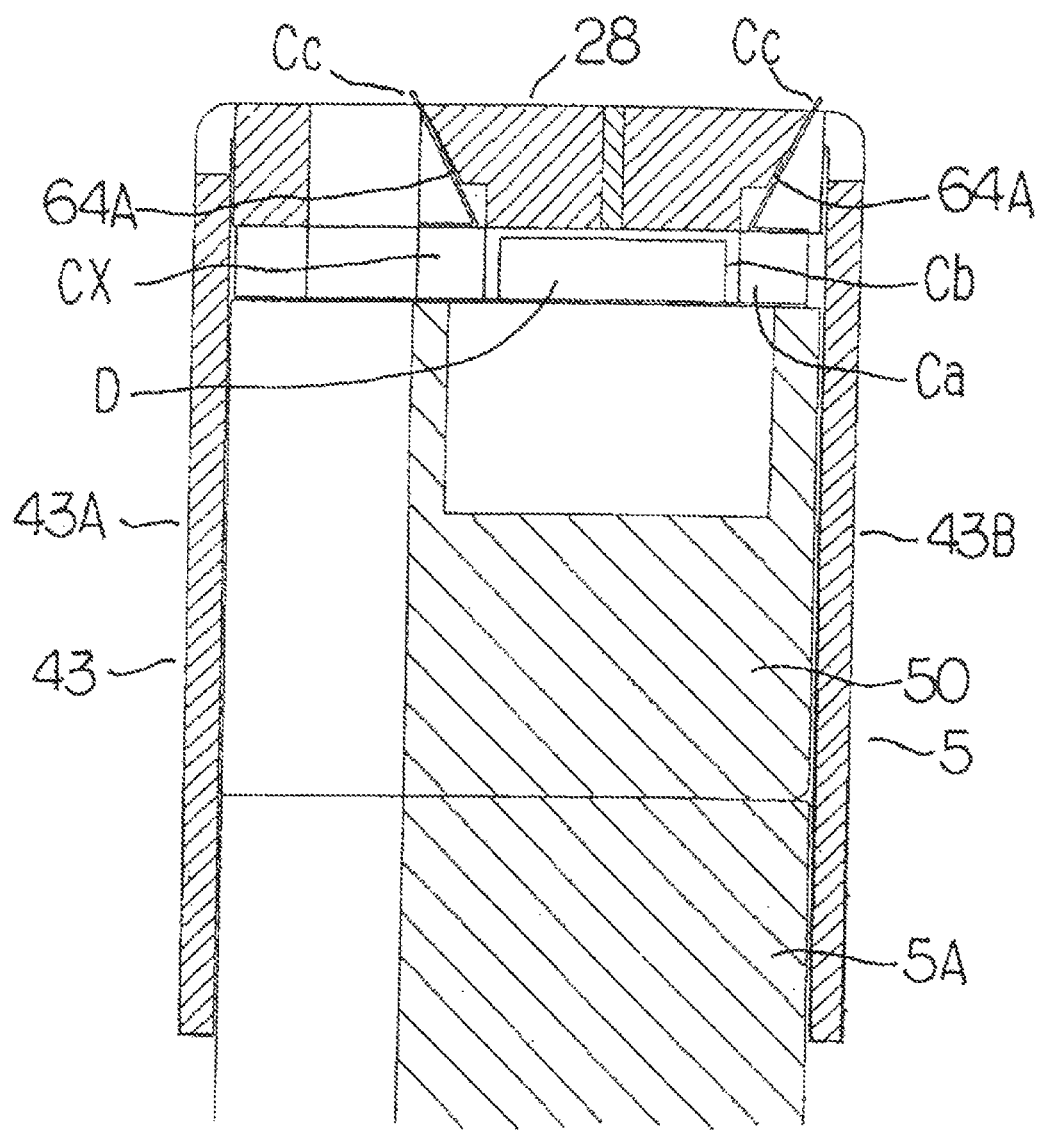
FIG. 17 is a diagram vertically sectioned from the position D, similarly to FIG. 11.

An information identification portion 66 for type determination is provided on the tape processing unit 28, and this information identification portion 66 is constituted of an information identification portion 67 for operator identification of the electronic component mounting device 1 and an information identification portion 68 of the electronic component mounting device 1. The type, such as "W8S", for example, or the like is stamped on the information identification portion 67 for the operator identification, so that the operator can identify the type of the tape processing unit 28 by visual recognition. Further, the type is assigned to the information identification portion 68 of the electronic component mounting device 1 in binarized information (bits) employing four dots so that the classification (type) of the tape processing unit 28 in which printings of black dots are 0 to 15 and the type thereof are recognized such that the leftmost portion in FIG. 16 is "W8S", that adjacent thereto on the right side is "W8M", that adjacent thereto on the right side is "W8L", and the rightmost portion is "W811", for example, as shown in FIG. 16.

While the information identification portion 68 has been the binarized information (bits) employing the four dots as described above, that allowing direct character recognition or bar code information (one-dimensional or two-dimensional) may be stuck, or a recording medium such as a memory tag or a μ-chip may be embedded. In a case of using such a medium, individual management can also be enabled by also adding a unique management code to the information, in addition to the type information of the tape processing unit 28.

Figures 18, 19:
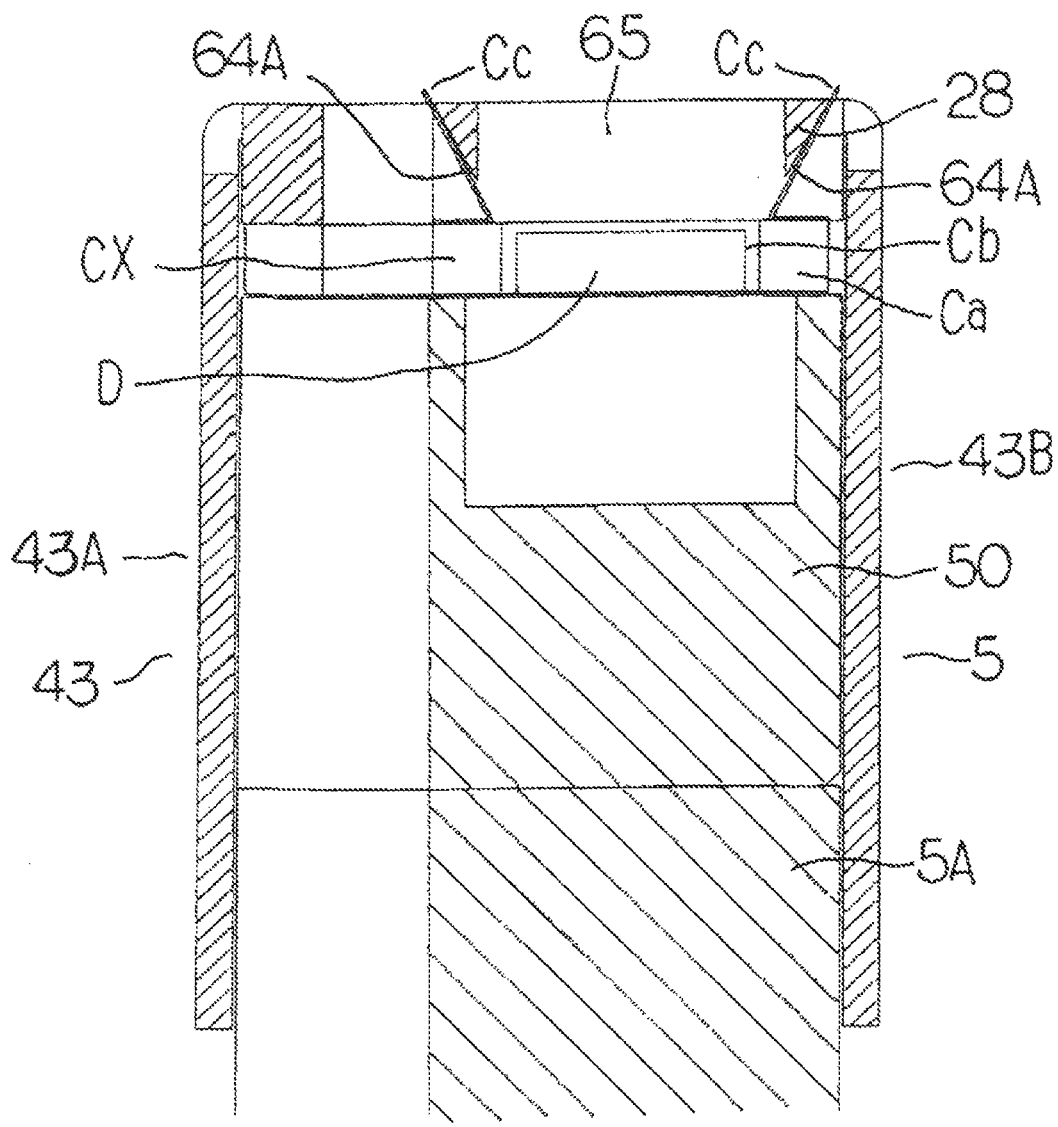
FIG. 18 is a diagram vertically sectioned from the position E, similarly to FIG. 12.
FIG. 19 is a diagram showing a relation table about types of tape processing units and object electronic components.

As shown in FIG. 19 which is a relation table (stored in a storage unit 80) of the types of the tape processing units 28 and object electronic components, the range of the object electronic components is "0402 to 0603", the dimensions of these electronic components in the X direction are 0.40 to 0.60 mm and the dimensions in the Y direction are 0.20 to 0.30 mm in the type "W8S". The range of these object electronic components is "1005 to 1608", the dimensions of these electronic components in the X direction are 0.61 to 1.60 mm and the dimensions in the Y direction are 0.31 to 3.40 mm in the type "W8M". The range of the object electronic components is "1608 to 2012", the dimensions of these electronic components in the X direction are 1.61 to 2.10 mm and the dimensions in the Y direction are 0.31 to 3.40 mm in the type "W8L". The range of the object electronic components is "2012 to 3225", the dimensions of these electronic components in the X direction are 2.11 to 4.30 mm and the dimensions in the Y direction are 0.31 to 3.40 mm in the type "W8LL". In other words, it means that the type "W8S", for example, can handle electronic components in which the dimensions of the electronic components in the X direction are in the range of 0.40 to 0.60 mm and the dimensions in the Y direction are in the range of 0.20 to 0.30 mm.

Figure 20:
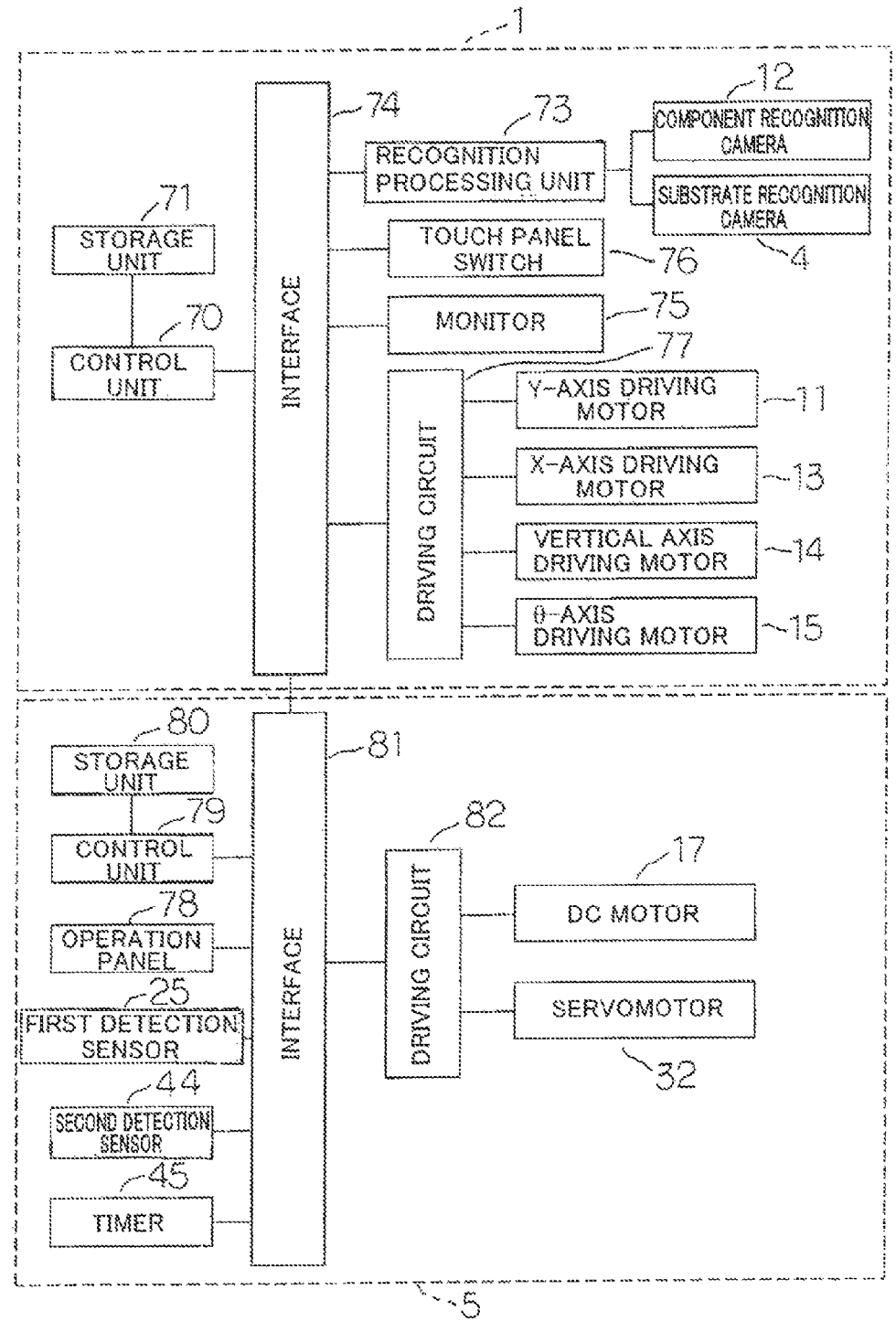
FIG. 20 is a control block diagram of an electronic component mounting device.

When describing a control block diagram of the electronic component mounting device 1 in FIG. 20, the electronic component mounting device 1 includes the control unit 70 as a control means unifying/controlling this device 1, a determination means, an execution means, an instruction means and the like and a storage unit 71 connected to the control unit 70 through a bus line. The control unit 70 unifies/controls operations related to a component mounting operation of the electronic component mounting device 1 on the basis of data stored in the storage unit 71.

In other words, the control unit 70 controls driving of the Y-axis driving motor 11, the X-axis driving motor 13, the vertical axis driving motor 14, the θ-axis driving motor 15 and the like and controls the respective component supply units 5 through an interface 74 and a driving circuit 77. In FIG. 20, plurally present ones such as the mounting heads 7 and the component supply units 5 are omitted as single components, for the convenience of illustration.

Mounting data (see FIG. 24) are stored in the storage unit 71 every type of the printed board P related to component mounting, and information about the X direction (denoted by X), the Y direction (denoted by Y) and the angle (denoted by Z) in the printed board P, arrangement number information of each component supply unit 5 etc. are stored every mounting order (every step number).

Information about the type (component ID) of each electronic component corresponding to the arrangement number (lane number) of each of the component supply units 5, i.e., component arrangement information (see FIG. 25) is stored in the storage unit 71 (every type of each printed board P), and this component arrangement information is data as to which component supply unit 5 is loaded on which position of the cart base. Further, component library data (see FIG. 26) related to characters etc. of the electronic component such as the dimensions of the electronic component in the X direction and the Y direction is stored in every component ID.

Numeral 73 denotes a recognition processing unit connected to the control unit 70 through the interface 74, and recognition processing of images picked up and incorporated by the component recognition camera 12 and images picked up and incorporated by the substrate recognition camera 4 is performed in the recognition processing unit 73, so that the processing results are transmitted to the control unit 70. In other words, the control unit 70 outputs instructions to the recognition processing unit 73 to perform recognition processing (calculation of the quantity of misregistration etc.) on the images picked up by the component recognition camera 12 and the images picked up by the substrate recognition camera 4, and receives recognition processing results from the recognition processing unit 73.

Numeral 75 denotes a monitor displaying component images, screens for setting various types of data etc. and this monitor 75 is provided with various touch panel switches 76 as input means, so that the operator can perform various setting operations by operating the touch panel switches 76.

The component supply unit 5 introducing and intermittently feeding the storage tape CX with the DC motor 17 and the servomotor 32 includes a control unit 79 and a storage unit 80. Numeral 82 denotes a driving circuit connected to the control unit 79 through an interface 81 respectively, and the control unit 79 controls the DC motor 17 and the servomotor 32 through the driving circuit 82. The control unit 79 provided on this component supply unit 5 is connected to the control unit 70 provided on the electronic component mounting device 1 through the interfaces 81 and 74.

Figure 4:
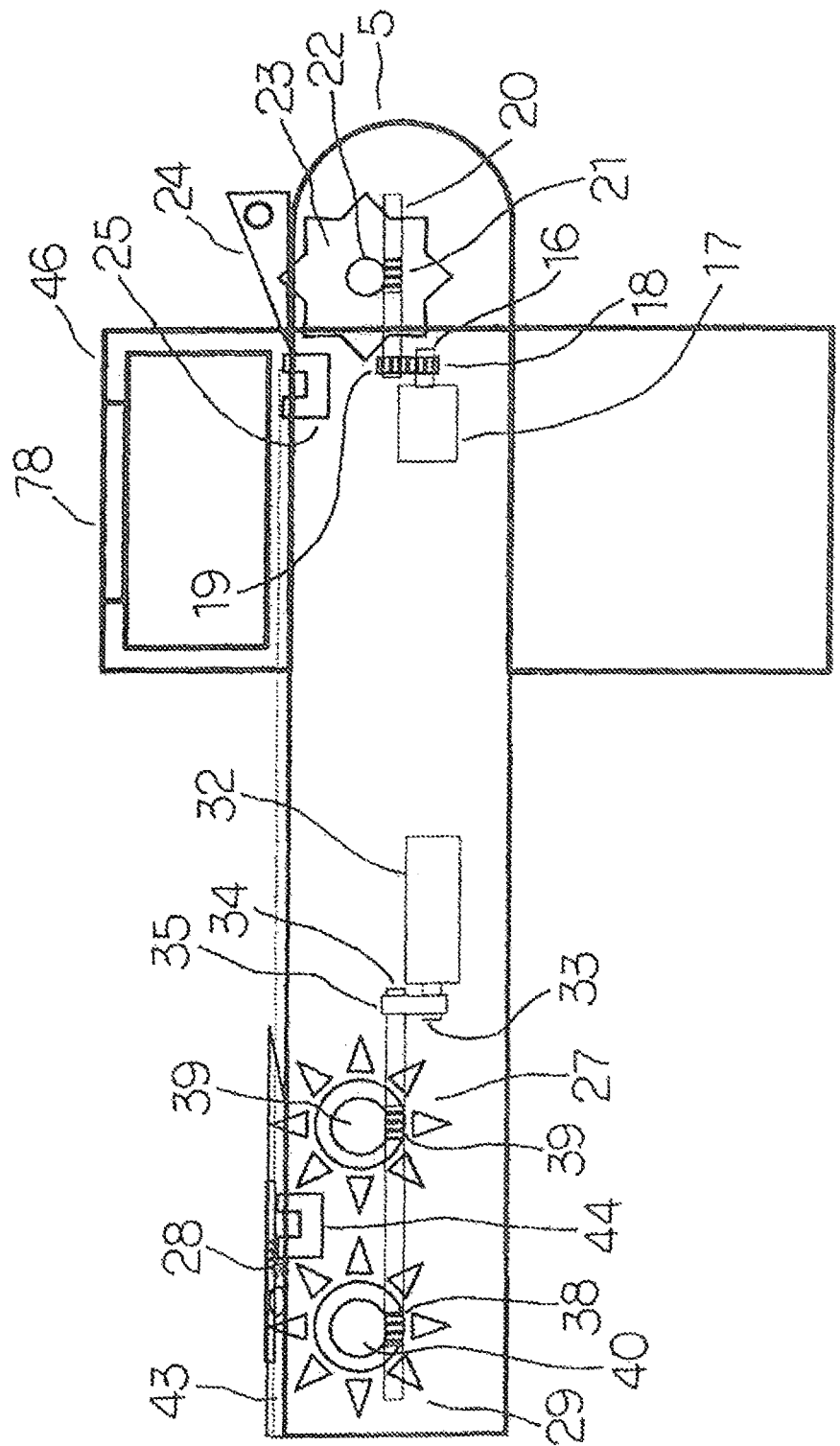
FIG. 4 is a schematic side elevational view of a component supply unit.
Figure 5:
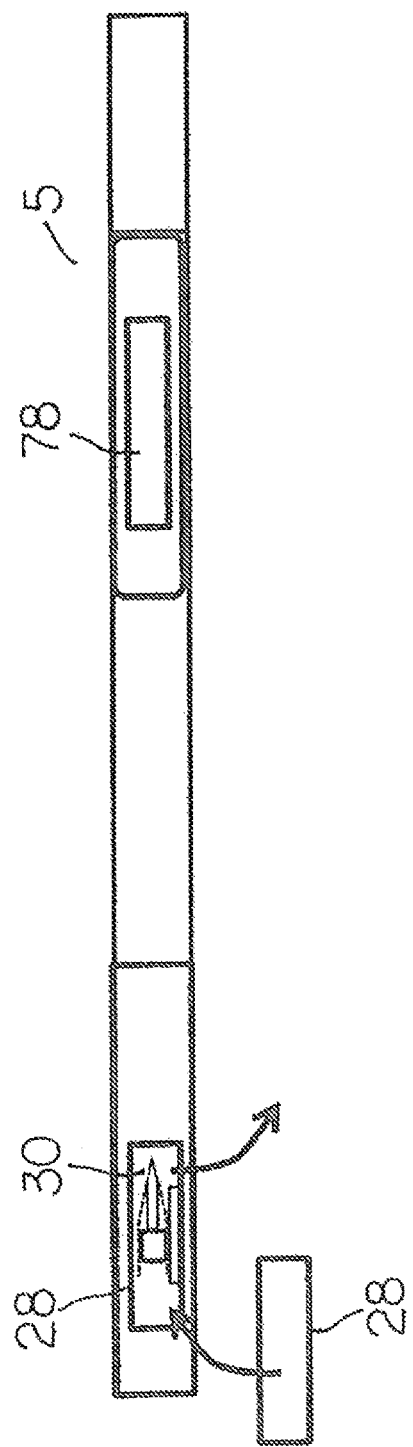
FIG. 5 is a schematic plan view of the component supply unit.
Figure 21:
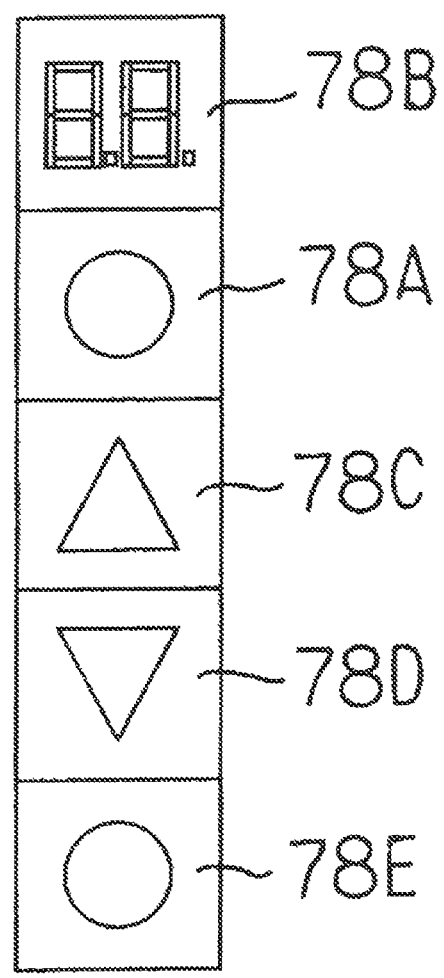
FIG. 21 is a diagram showing an operation panel.

As shown in FIGS. 4 and 5, an operation panel 78 is provided on an upper surface of a handle 46 of the component supply unit 5, and this operation panel 78 is provided with a lane number selection button 78 for selecting the arrangement number (lane number) of the component supply unit 5, a display portion 78B displaying the lane number while increasing the same one by one every left portion pressing of this lane number selection button 78A while displaying the lane number while reducing the same one by one every right portion pressing, a feeding button 78C, a return button 78D and a loading button 78E (see FIG. 21).

At a time of detaching the component supply unit 5 from the aforementioned feeder base or mounting the former on the latter, therefore, the operator can select (change) the arrangement number (lane number) of the component supply unit on the basis of a pressing operation of the lane number selection button 78A while observing the display portion 78B. It follows that the arrangement number (lane number) of the selected component supply unit 5 is rewritten/stored in the storage units 89 and 70.

An operation of loading the storage tape CX on the component supply unit 5 is now described. First, the operator sets the tape pressing member 24 after detaching the tape pressing member 24, placing the forward end portion of the storage tape CX on the guide path and engaging the tape feeding teeth of the first sprocket 23 with the feeding holes Cd of the storage tape CX.

When the operator performs a pressing operation of the loading button 78E of the operation panel 78, the control unit 79 controls the device to drive the DC motor 17 by a prescribed time with a timer 45 if the first detection sensor 25 and the second detection sensor 4 have not detected the storage tape CX, and the storage tape CX is successively inserted into an inner portion in the component supply unit 5 due to rotation of the first sprocket 23.

Following this insertion, the control unit 79 stops the driving of the DC motor 17 when counting the prescribed time with the timer 45, and starts driving of the DC motor 17 and the servomotor 32 when the first detection sensor 25 detects the forward end of the storage tape CX, so that the storage tape CX is moved frontward by the first sprocket 23, the second sprocket 27 and the third sprocket 29.

The control unit 79 continues the moving operation according to a previously set feed rate, stops the driving of the DC motor 17 when the second detection sensor 4 detects the forward end of the storage tape CX during this movement, and stops the servomotor 32 while forcibly decelerating the same. When the second detection sensor 44 cannot detect the forward end of the storage tape CX in this case although the aforementioned previously set feed rate has been performed, the control unit 79 controls the DC motor 17 and the servomotor 32 to abnormally stop the same.

Then, the control unit 79 repeats a reversal operation by minimum pitch feeding until the second detection sensor 44 does not detect the forward end of the storage tape CX in consideration of the quantity of overrun of the storage tape CX at the time from the aforementioned deceleration up to the stoppage by the servomotor 32, to define the forward end position of the storage tape CX. In other words, the storage unit 79 repeats the reversal operation of the servomotor 32 at the minimum pitch and a stop operation thereby defining the forward end position of the storage tape CX.

While the first sprocket 23 includes a one-way clutch and does not reverse, the storage tape CX engaging with the feeding teeth of the second sprocket 27 is slid out rearward due to thrust of the servomotor 32 since the quantity of returning is small and the tooth height of the first sprocket 23 is low.

Then, the control unit 79 controls the driving of the servomotor 32 to deliver the forward end portion of the storage tape CX to a position immediately in front of a blade of the cutter 30 at a high speed in a single feeding operation of a prescribed quantity. In other words, the control unit 79 delivers the storage tape CX up to the position immediately in front of the blade of the cutter 30 at the high speed according to design dimensions, due to the definition of the forward end position of the storage tape CX.

Thereafter the control unit 79 inserts the storage tape CX into a cutting-open zone for the cover tape Cc with the cutter 30, and performs cut-opening of the cover tape Cc. In other words, the forward end of the cutter 30 first slips into a space between the carrier tape Ca and the cover tape Cc, and the cover tape Cc is cut open by the blade formed on an upper portion of the cutter 30 in a state inclined upward, following subsequent traveling of the carrier tape Ca and the cover tape Cc. Further, the cover tape Cc is guided by the guide surfaces 64 to be divided into the left and right sections and pushed open upward. In this case, the blade opens the cover tape Cc upward not to separate the same from the carrier tape Ca but to cut open the same in the left and right directions with respect to the traveling direction, and hence the control unit 79 performs the single feeding of the prescribed quantity at an ultralow speed or ultralow acceleration.

Then, the control unit 79 performs a pitch feeding operation for cuing the position of the storage recess portion Cb on the forward end portion of the storage tape CX into the component adsorption/extraction position PU by a prescribed number of times. In this case, the control unit 79 executes a prescribed feeding operation for carrying the position of the storage recess portion Cb to the component adsorption/extraction position PU according to the feed pitch, according to the accumulated feed rate (quantity of driving/management of the servomotor 32 resulting from engagement of the tape feeding teeth of the second sprocket 27 with the feeding holes Cd) from the position of the previous definition of the forward end position of the storage tape CX.

The control unit 79 performs this automatic matching of the position of the storage recess portion Cb by controlling the feed rate due to the positional relation of the storage recess portion Cb according to taping standards on the basis of a cut position of the forward end of the storage tape CX according to the criterion of the feeding holes Cd.

Figure 22:
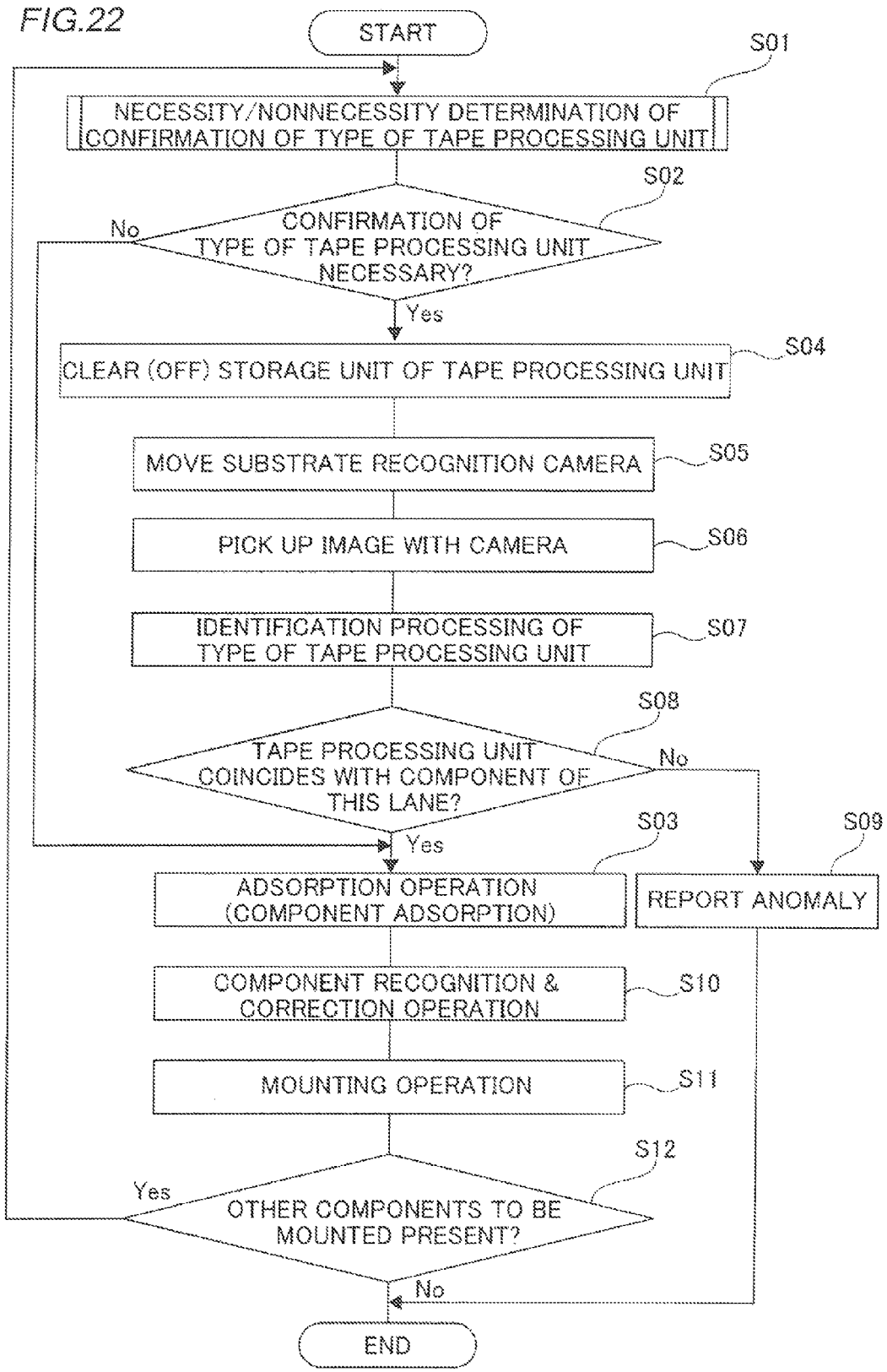
FIG. 22 is a diagram showing a flowchart related to automatic collation of the type of a tape processing unit.
Figure 23:
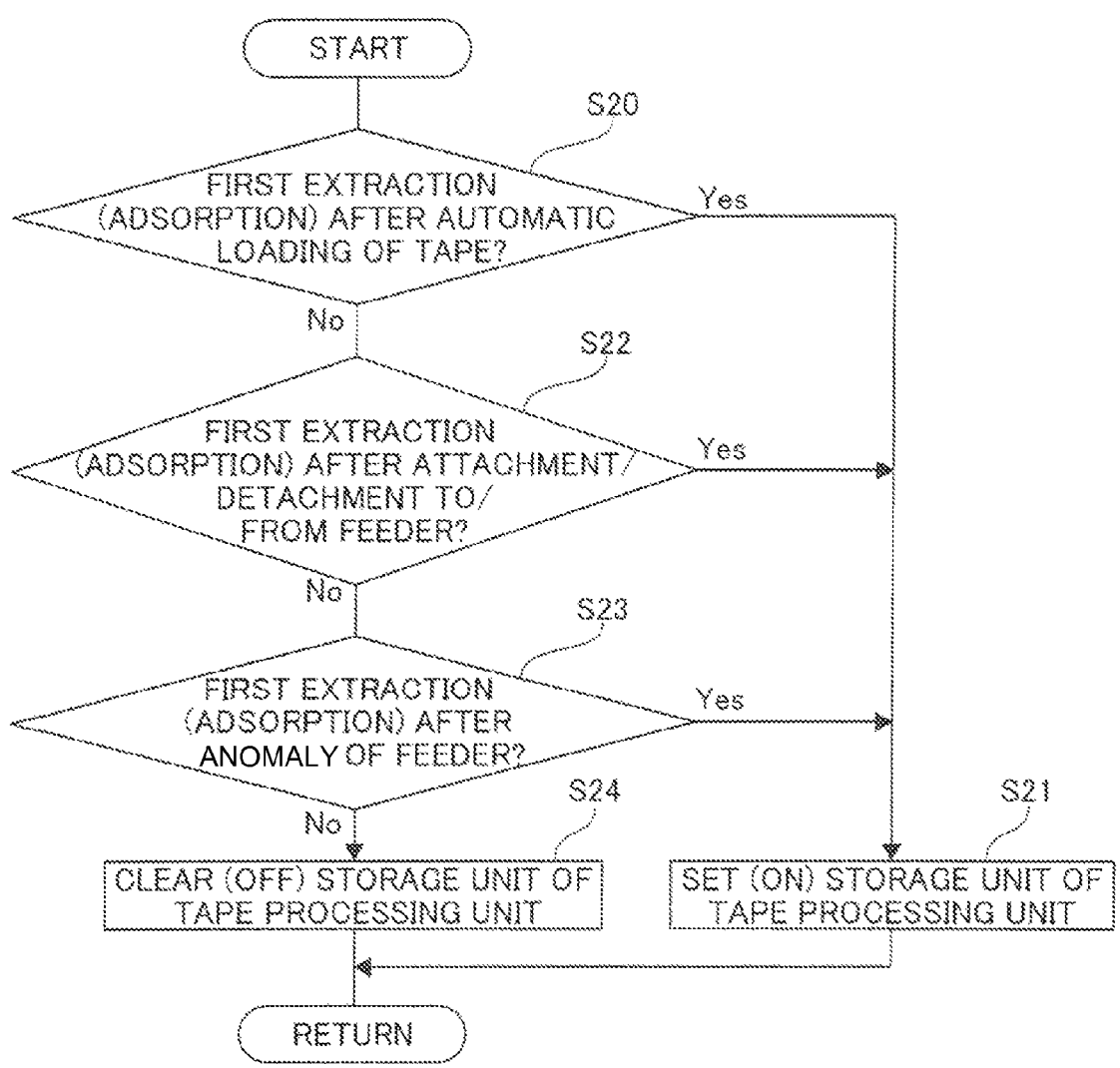
FIG. 23 is a diagram showing a flowchart related to necessity/nonmecessity determination of confirmation of the type of the tape processing unit.

Then, the following description is made on the basis of a flowchart of FIG. 22 related to automatic collation of the type of the tape processing unit 28 and a flowchart of FIG. 23 related to necessity/nonnecessity determination of confirmation of the type of the tape processing unit 28. It is assumed here that a feeder denotes the component supply unit 5.

First, necessity/nonnecessity determination of the confirmation of the type of the tape processing unit 28 is performed by the control unit 70 at a step S01 in FIG. 22. When describing this necessity/nonnecessity determination on the basis of FIG. 23, whether or not it is first extraction of the electronic components D after the aforementioned automatic loading of the storage tape CX is first determined by the control unit 70 (step S20).

When it is determined as the first extraction of the electronic components D after the aforementioned automatic loading (loading of the storage tape CX on the component supply unit 5) of the storage tape CX in this case, the control unit 70 controls the control unit 79 to set ("ON") the contents of the storage unit 80 of the tape processing unit 28 (step S21). When it is determined as not the first extraction of the electronic components D after the automatic loading of the storage tape CX, on the other hand, whether or not it is first extraction of the electronic components D after attachment/detachment of the component supply unit 5 is subsequently determined by the control unit 70 (step S22).

When it is determined as the first extraction of the electronic components D after the attachment/detachment (mounting/demounting of the component supply unit 5 on/from the feeder base) of the component supply unit 5 in this case, the control unit 70 controls the control unit 79 to set ("ON") the contents of the storage unit 80 (step S21).

When it is determined as not the first extraction of the electronic components D after the attachment/detachment, on the other hand, whether or not it is first extraction of the electronic components D after anomaly (type of the tape processing unit is mismatched) of the component supply unit 5 is subsequently determined by the control unit 70 (step S23).

When it is determined as the first extraction of the electronic components D after the anomaly occurrence from the component supply unit 5 in which this anomaly has occurred in this case, the control unit 70 controls the control unit 79 to set ("ON") the contents of the storage unit 80 of the tape processing unit 28 (step S21). When it is determined as not the first extraction of the electronic components D after the anomaly, on the other hand, the control unit 70 controls the control unit 79 to clear ("OFF") the contents of the storage unit 80 (step S24).

When terminating the aforementioned processing at the step S21 or S24, the control unit 70 returns to the step S02 of FIG. 22 to make a determination as to whether or not the confirmation of the type of the tape processing unit 28 is necessary, i.e., whether or not the contents of the storage unit 80 of the tape processing unit 28 are "ON" is determined by the control unit 70.

When the contents of the storage unit 80 are "OFF" and the confirmation of the type of the tape processing unit 28 is determined as not necessary in this case, the control unit 70 performs control to advance to a step S03 and to perform an electronic component extraction operation. When it is determined as the first extraction of the electronic components D after the automatic loading of the storage tape Cx, it is determined as the first extraction of the electronic components D after the attachment/detachment of the component supply unit 5 or it is determined as the first extraction of the electronic components D after the anomaly (type of the tape processing unit 28 is mismatched) of the component supply unit 5, the contents of the storage unit 80 are "ON" and the confirmation of the type of the tape processing unit 28 is determined as necessary (step S02), the control unit 70 controls the control unit 79 to clear ("OFF") the contents of the storage unit 80 of the tape processing unit 28 (step S04).

Then, the control unit 70 controls the Y-axis driving motor 11 and the X-axis driving motor 13 through the driving circuit 77 to control the same to move the substrate recognition camera 4 (step S05) and picks up an image of the information identification portion 68 (step S06), so that the recognition processing unit 73 recognizes/processes this picked-up image and the control unit 70 performs identification processing of the type of the tape processing unit 28 on the basis of the result of this recognition processing (step S07). In this case, the identification processing of the type of the tape processing unit 28 can be performed through the number and positions of black circles.

While the identification processing of the type of the tape processing unit 28 has been performed by using the substrate recognition camera 4 etc. as to content detection of the information recognition portion 68, the processing is not restricted to this, but may be performed by other detection means.

Then, whether or not electronic components handleable by this tape processing unit 28 coincide with the electronic components of this component arrangement number in the feeder base is determined by the control unit 70 (step S08). When X-dimensions and Y-dimensions constituting component library data of electronic components obtained from arrangement number information of the component supply unit 5, every mounting order (every step number) constituting mounting data and information (component arrangement information) of the type (component ID) of each electronic component corresponding to this arrangement number (lane number) are determined as not coinciding with X-dimensions and Y-dimensions (acquired from the relation table of the types of the tape processing units 28 and the object electronic components in FIG. 19) of the electronic components corresponding to the type of the tape processing unit 28 whose image the substrate recognition camera 4 has picked up to be subjected to recognition progressing and determined by the recognition processing unit 73 in this case, the control unit 70 reports an anomaly (step S09). For example, the control unit 70 controls the monitor 75 to display a message "The type of this tape processing unit and the electronic components do not coincide with each other. Confirm the component supply unit."

When the same are determined as coinciding with each other, the control unit 70 performs control to perform extraction of the electronic components (step S03).

After extracting the electronic components from this component supply unit 5, the control unit 70 performs control so that the component recognition camera 12 picks up images of the electronic components adsorbed/held by the adsorption nozzles 7 while the recognition processing unit 73 recognizes/processes these picked-up images and performs necessary correction operations (step S10), and performs a mounting operation of the electronic components on the printed boards P (step S11). In this case, images of the positioning marks provided on the printed boards P are picked up with the substrate recognition camera 4, so that the recognition processing unit 73 recognizes/processes these picked-up images and performs the aforementioned correction operation while also adding the results of this recognition, to perform the mounting operation of the electronic components.

Then, the control unit 70 determines whether or not other electronic components to be mounted are present on these printed boards P (step S12), returns to the step S02 in a case where the same are present, and thereafter similarly repeats the processing until other electronic components to be mounted disappear.

While the embodiment of the present disclosure has been described in the aforementioned manner, various substitutional examples, corrections or modifications are possible for those skilled in the art on the basis of the above description, and the present disclosure includes the aforementioned various substitutional examples, corrections or modifications in a range not deviating from the subject matter thereof.

What is claimed is:

1. A device for mounting an electronic component, the device comprising:
   a feeder to which a cover tape processing unit is detachably attached; and
   a control device, the control device:
   determining whether or not confirmation of the type of the cover tape processing unit is necessary;
   executing identification processing of the type of the cover tape processing unit when the confirmation of the type of the cover tape processing unit is determined as necessary;
   determining whether or not the identification processing of the type has been performed and an electronic component handleable by the cover tape processing unit coincides with an electronic component of a component arrangement number in a feeder base; and controlling the device for mounting the electronic component to perform an extraction operation of the electronic component with a component extractor when the electronic component is determined as coinciding, wherein the cover tape processing unit includes an outlet opening set up for exposing the electronic component having been sealed in a storage portion by a cover tape covering the storage portion of a storage tape, supplying the electronic component to a component extraction position and extracting the supplied electronic component with the component extractor, and mounting the electronic component extracted from the component supply unit on a substrate.

2. The device for mounting an electronic component according to claim 1, wherein the cover tape processing unit includes a cutter successively cutting open the cover tape along a traveling direction following traveling of the storage tape and exposing the electronic component in the storage portion.

3. The device for mounting an electronic component according to claim 1, wherein the control device determines that it is necessary to confirm the type of the cover tape processing unit when the electronic component is extracted for a first time after loading the storage tape on the feeder.

4. The device for mounting an electronic device according to claim 1, wherein the control device determines that it is necessary to confirm the type of the cover tape processing unit when the electronic component is extracted for a first time after attaching the feeder to the feeder base.

5. The device for mounting an electronic component according to claim 1, wherein the control device determines that it is necessary to confirm the type of the cover tape processing unit when the electronic component is extracted for a first time after an anomaly occurs in the feeder.

* * * * *